(12) United States Patent
Shimizu

(10) Patent No.: US 10,388,348 B2
(45) Date of Patent: Aug. 20, 2019

(54) SEMICONDUCTOR MEMORY DEVICE AND METHOD OF READ/WRITE OPERATION FOR VARIABLE RESISTANCE ELEMENTS

(71) Applicant: TOSHIBA MEMORY CORPORATION, Minato-ku, Tokyo (JP)

(72) Inventor: Naoki Shimizu, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/702,369

(22) Filed: Sep. 12, 2017

(65) Prior Publication Data
US 2018/0277189 A1    Sep. 27, 2018

(30) Foreign Application Priority Data

Mar. 21, 2017   (JP) ................... 2017-054726

(51) Int. Cl.
| | | |
|---|---|---|
| *G11C 11/22* | (2006.01) | |
| *G11C 11/16* | (2006.01) | |
| *G11C 13/00* | (2006.01) | |
| *G11C 29/06* | (2006.01) | |
| *G11C 29/14* | (2006.01) | |
| *G11C 29/46* | (2006.01) | |

(52) U.S. Cl.
CPC ........ *G11C 11/1675* (2013.01); *G11C 11/161* (2013.01); *G11C 11/1653* (2013.01); *G11C 11/1673* (2013.01); *G11C 11/1693* (2013.01); *G11C 13/0069* (2013.01); *G11C 29/06* (2013.01); *G11C 29/14* (2013.01); *G11C 29/46* (2013.01)

(58) Field of Classification Search
CPC .............. G11C 11/1675; G11C 11/161; G11C 11/1653; G11C 11/1673; G11C 11/1693
USPC .................. 365/145, 189.01, 189.02, 230.06
See application file for complete search history.

(56) References Cited

U.S. PATENT DOCUMENTS

| | | | | |
|---|---|---|---|---|
| 5,802,006 | A * | 9/1998 | Ohta ....................... | G11C 7/00 365/191 |
| 6,097,666 | A | 8/2000 | Sakui et al. | |
| 8,108,741 | B2 * | 1/2012 | Kim ....................... | G11C 29/28 365/201 |
| 9,990,251 | B2 * | 6/2018 | Kim .................... | G06F 11/1048 |

(Continued)

FOREIGN PATENT DOCUMENTS

| | | |
|---|---|---|
| JP | 11224492 A | 8/1999 |
| JP | 2007294014 A | 11/2007 |
| JP | 2009176375 A | 8/2009 |

*Primary Examiner* — Connie C Yoha
(74) *Attorney, Agent, or Firm* — Holtz, Holtz & Volek PC

(57) ABSTRACT

According to one embodiment, a semiconductor memory device includes a first memory cell having a first variable resistance element, a second memory cell having a second variable resistance element, and a first circuit which controls writing to the first memory cell and the second memory cell. The first circuit receives a first command instructing writing to the first memory cell, after receiving the first command, receives a second command instructing writing to the second memory cell, and after receiving the second command, performs writing to the second memory cell when performing writing to the first memory cell.

12 Claims, 27 Drawing Sheets

(56) References Cited

U.S. PATENT DOCUMENTS

| | | | | |
|---|---|---|---|---|
| 2003/0021177 A1* | 1/2003 | La | ............ | G11C 7/1006 |
| | | | | 365/233.1 |
| 2007/0266279 A1 | 11/2007 | Kawano | | |
| 2009/0190405 A1 | 7/2009 | Tokiwa et al. | | |
| 2010/0232055 A1* | 9/2010 | Lee | ............ | G11B 5/581 |
| | | | | 360/77.01 |
| 2013/0033928 A1* | 2/2013 | Kawahara | ............ | G11C 11/15 |
| | | | | 365/158 |
| 2013/0159617 A1* | 6/2013 | Yu | ............ | G06F 12/00 |
| | | | | 711/106 |
| 2013/0322155 A1* | 12/2013 | Ahn | ............ | G11C 13/0002 |
| | | | | 365/148 |
| 2015/0310904 A1* | 10/2015 | Kim | ............ | G11C 11/1693 |
| | | | | 365/158 |
| 2015/0355839 A1* | 12/2015 | Shim | ............ | G11C 8/12 |
| | | | | 711/103 |

* cited by examiner

Write current

Parallel state (low resistance)

Write current

Anti-parallel state (high resistance)

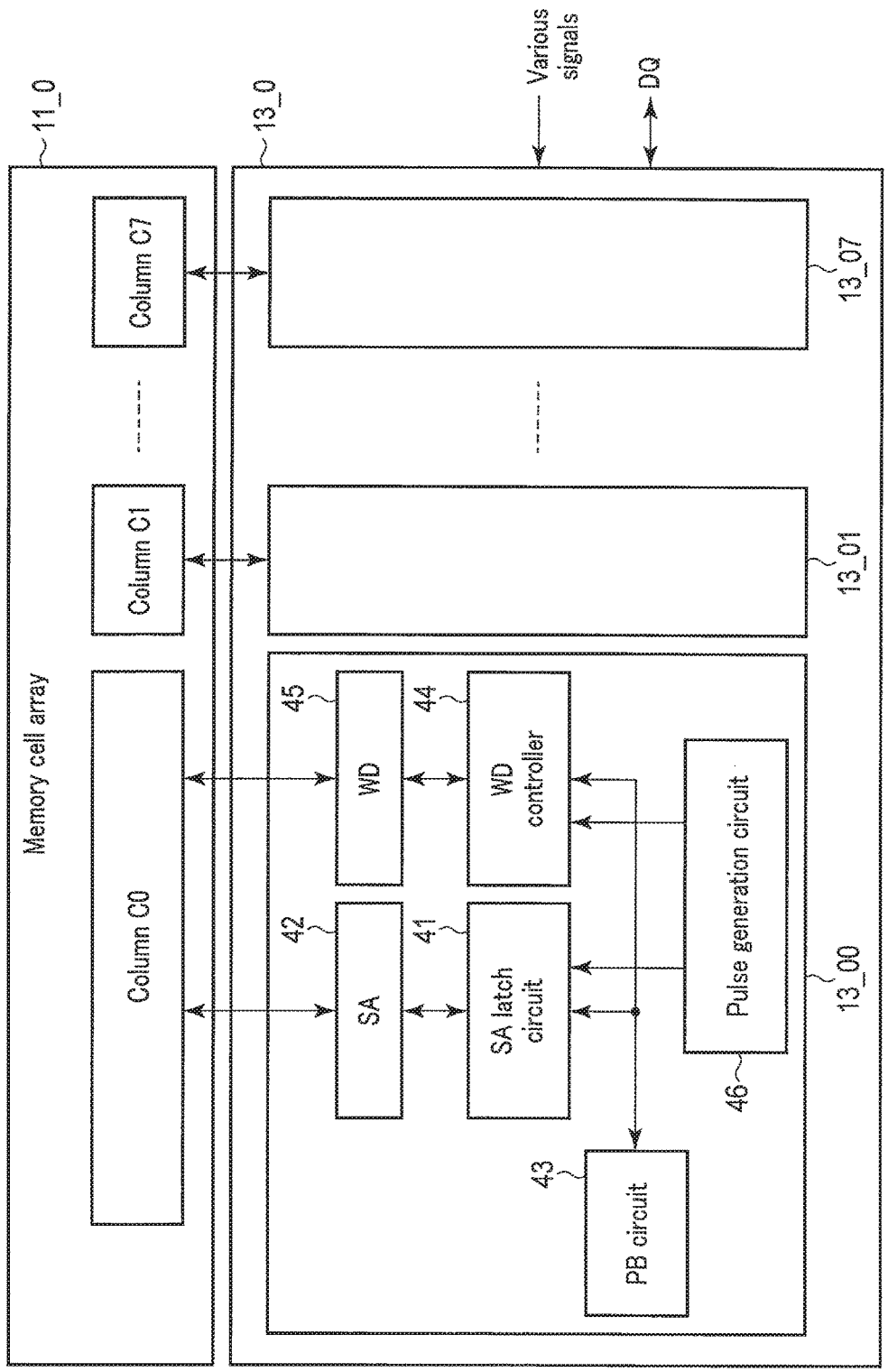
F I G. 4

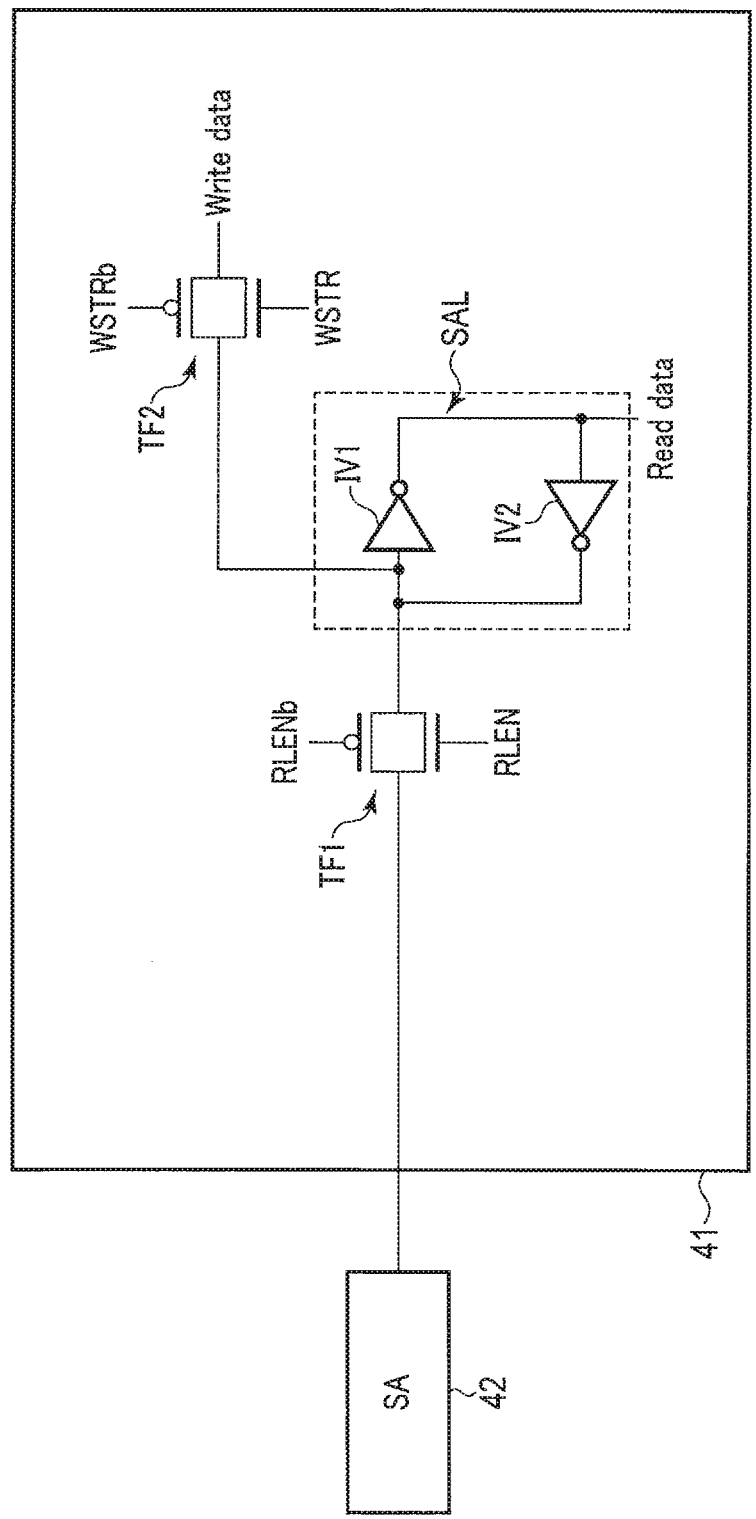
F I G. 5

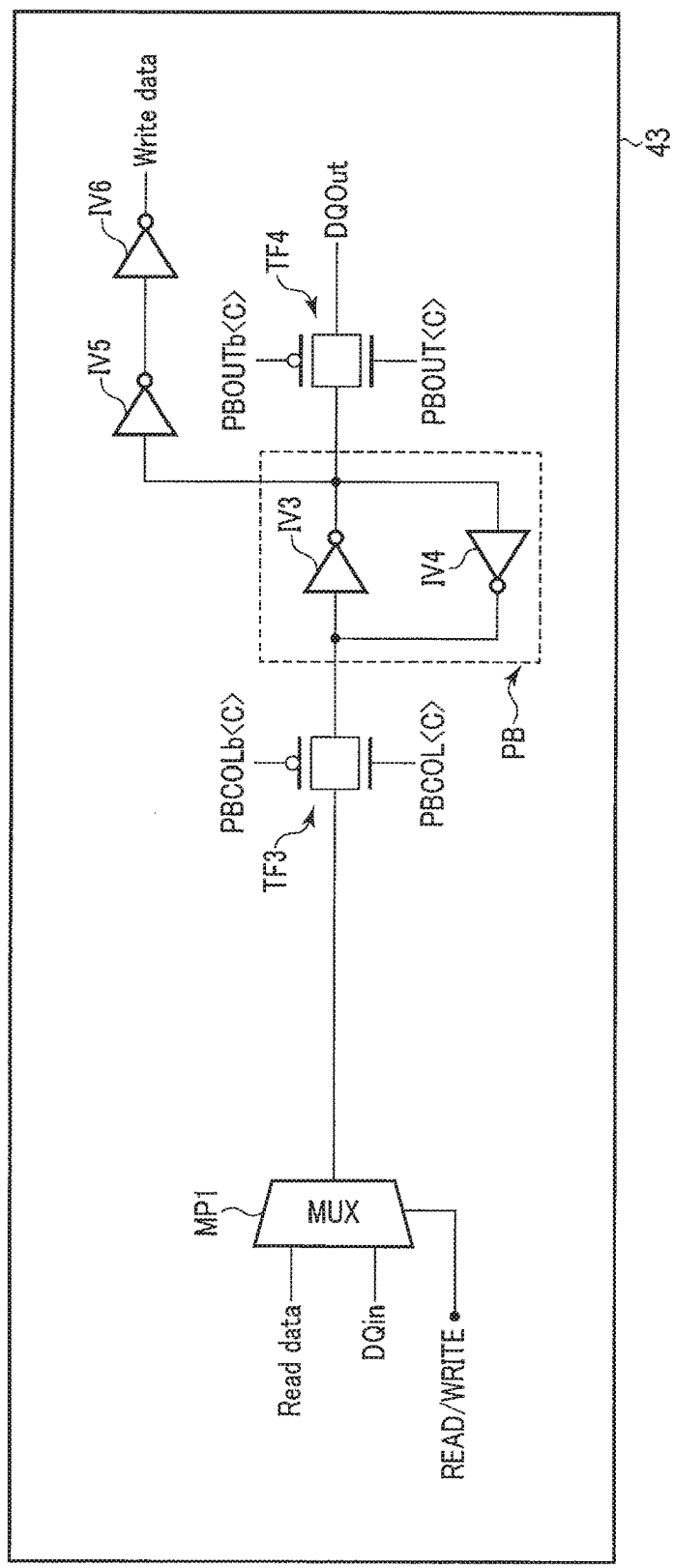
F I G. 6

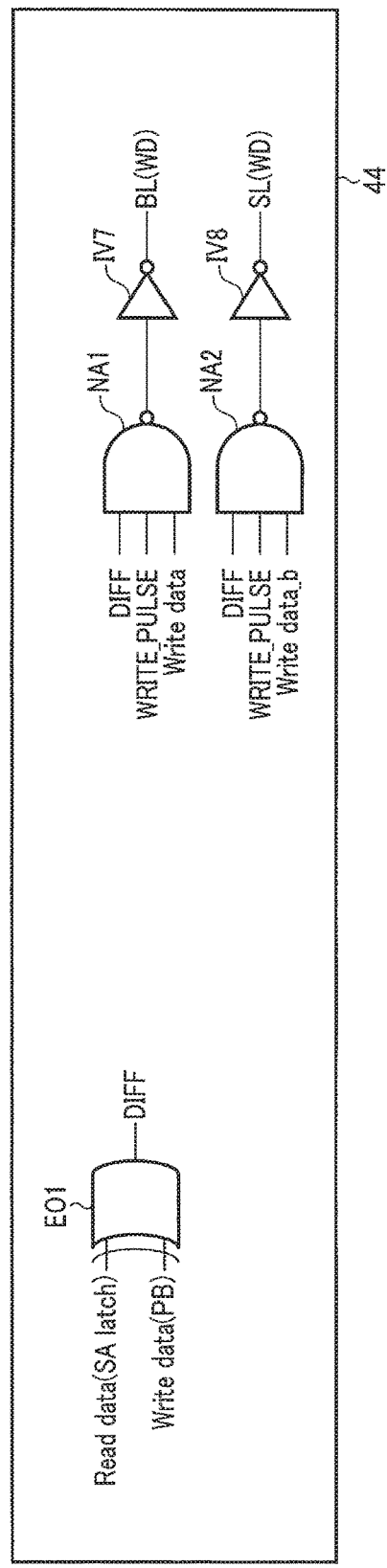
F I G. 7

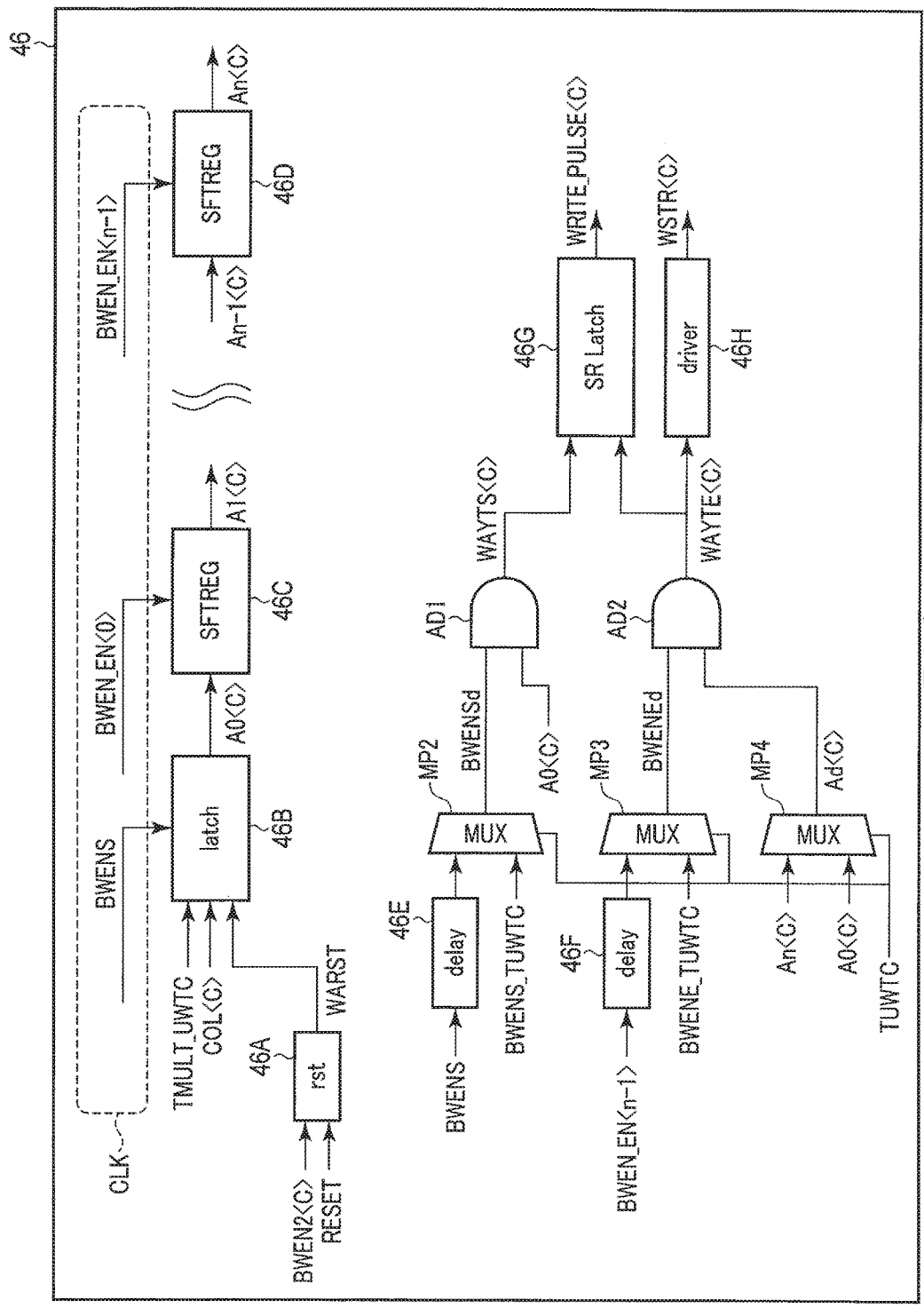
F I G. 8

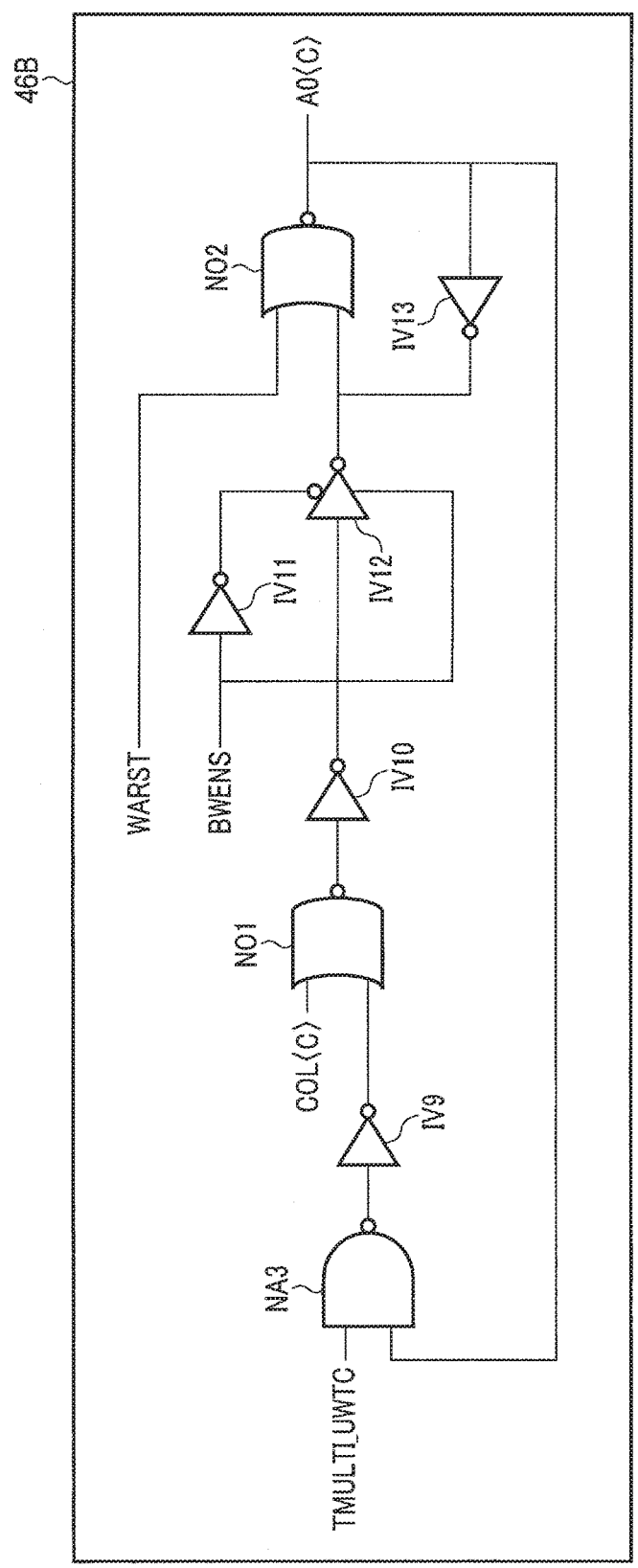
F I G. 9

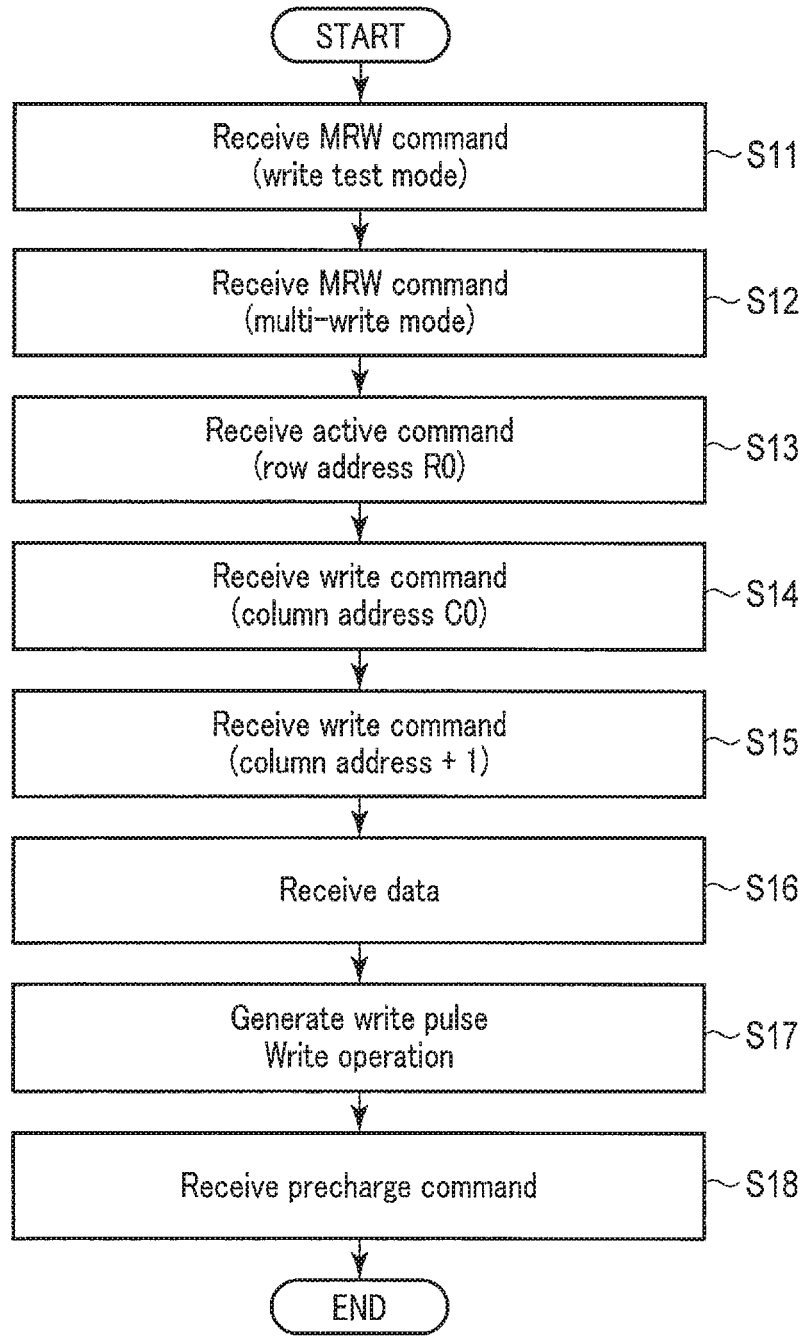
F I G. 10

| TMULTI_UWTC | WARST | BWENS | A0 | |
|---|---|---|---|---|
| L | L | L | Maintained | ⎫ |
| L | L | H | COL<0> | ⎬ Normal write mode |
| L | H | / | L | ⎭ |
| H | L | L | Maintained | ⎫ |
| H | L | H | A0=L→maintained<br>A0=H→COL<0> | ⎬ Multi-write mode |
| H | H | / | L | ⎭ |

F I G. 14

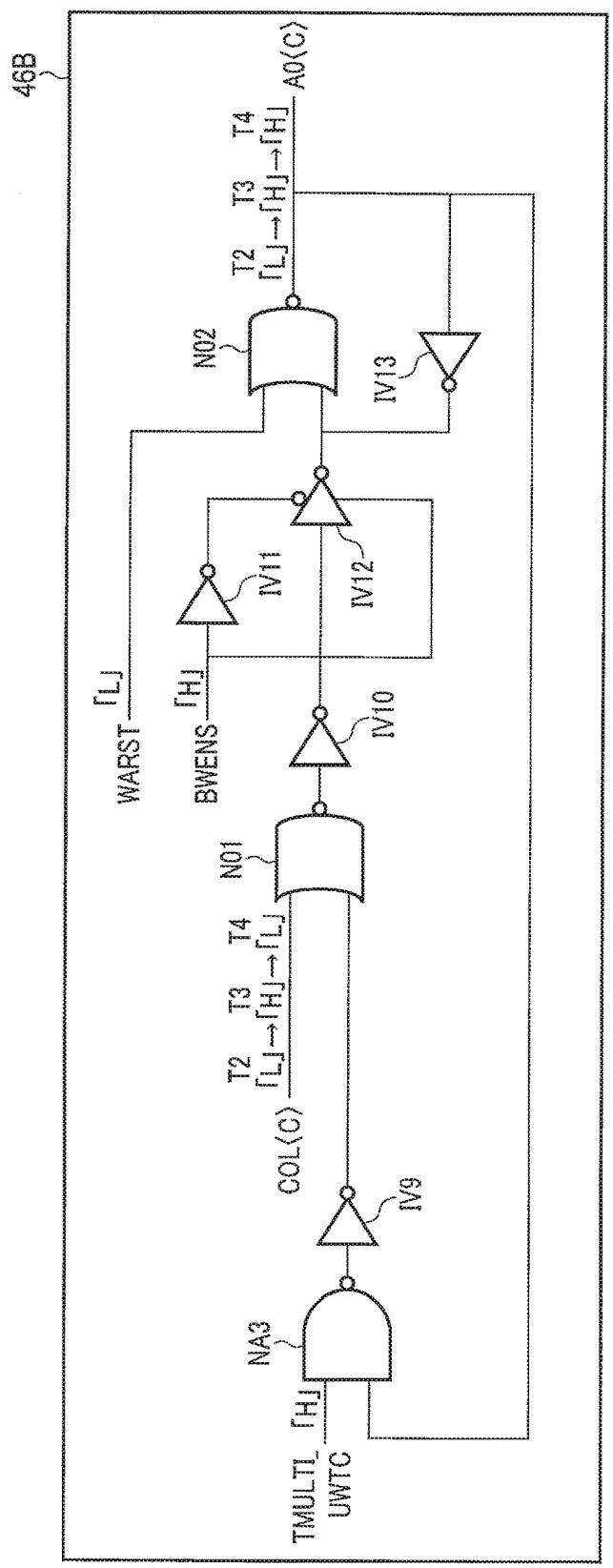
F I G. 15

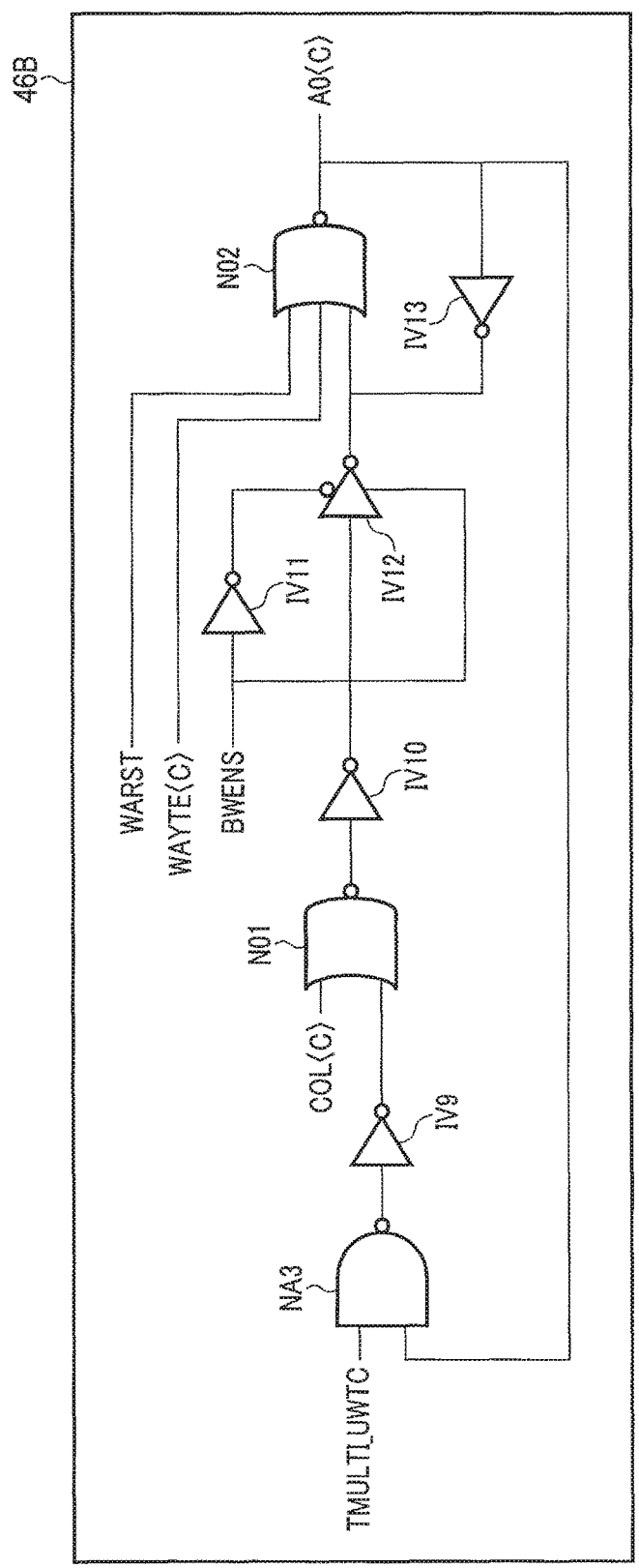
F I G. 16

FIG. 17

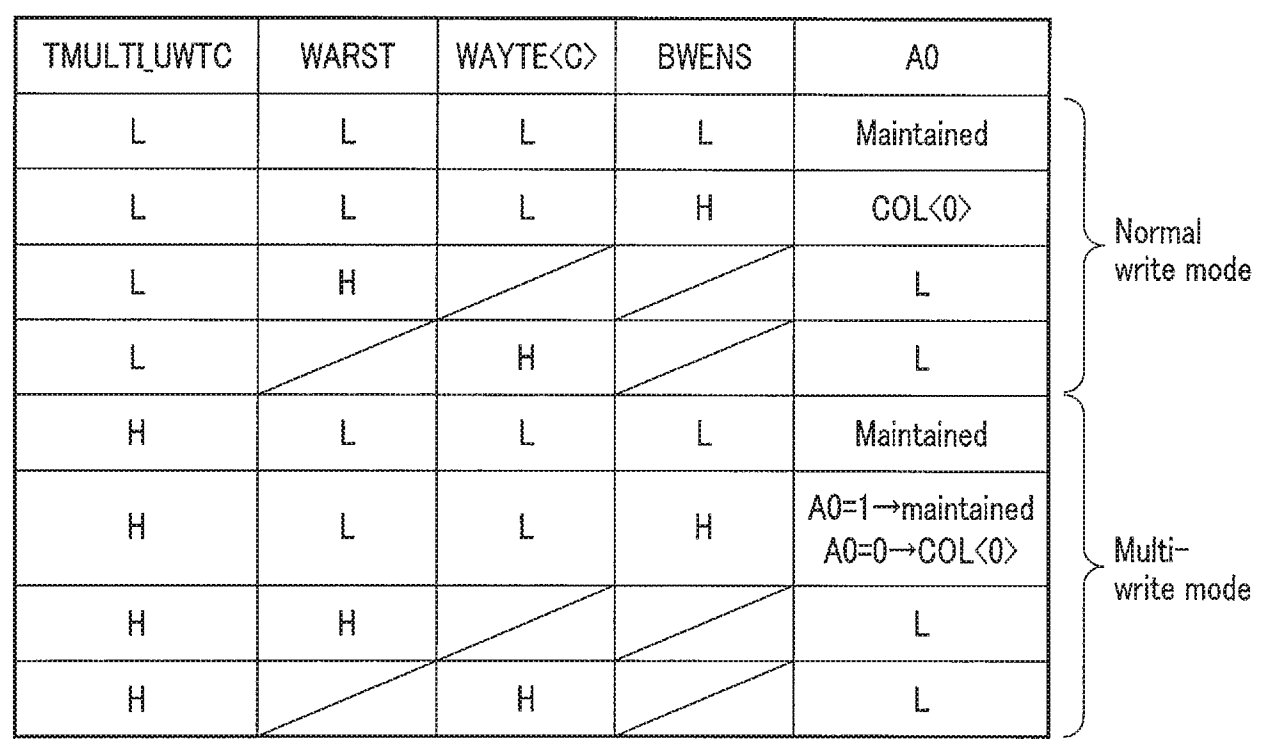

| TMULTI_UWTC | WARST | WAYTE<C> | BWENS | A0 | |
|---|---|---|---|---|---|
| L | L | L | L | Maintained | Normal write mode |
| L | L | L | H | COL<0> | |
| L | H | / | / | L | |
| L | L | H | / | L | |
| H | L | L | L | Maintained | Multi-write mode |
| H | L | L | H | A0=1→maintained / A0=0→COL<0> | |
| H | H | / | / | L | |
| H | L | H | / | L | |

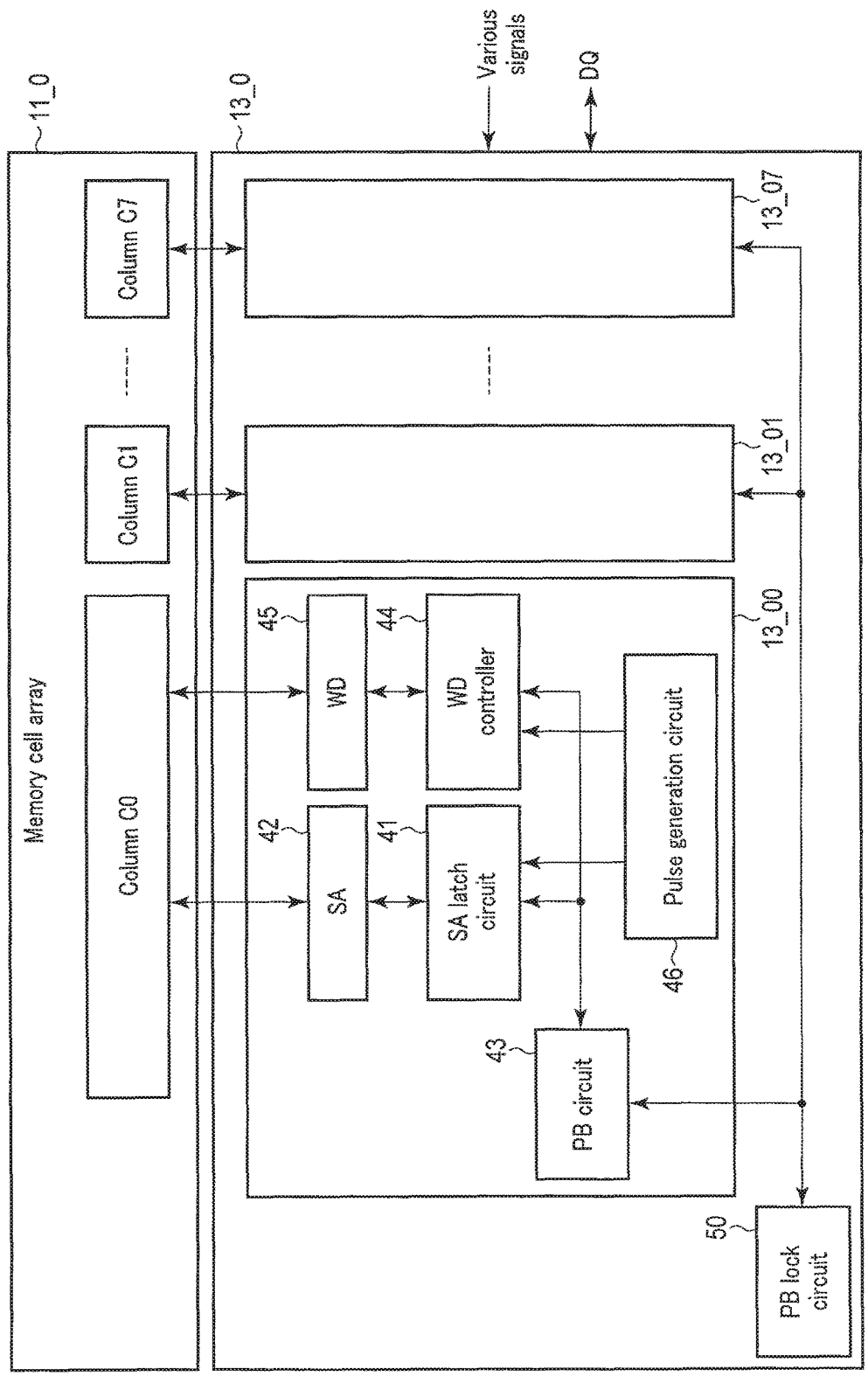
F I G. 18

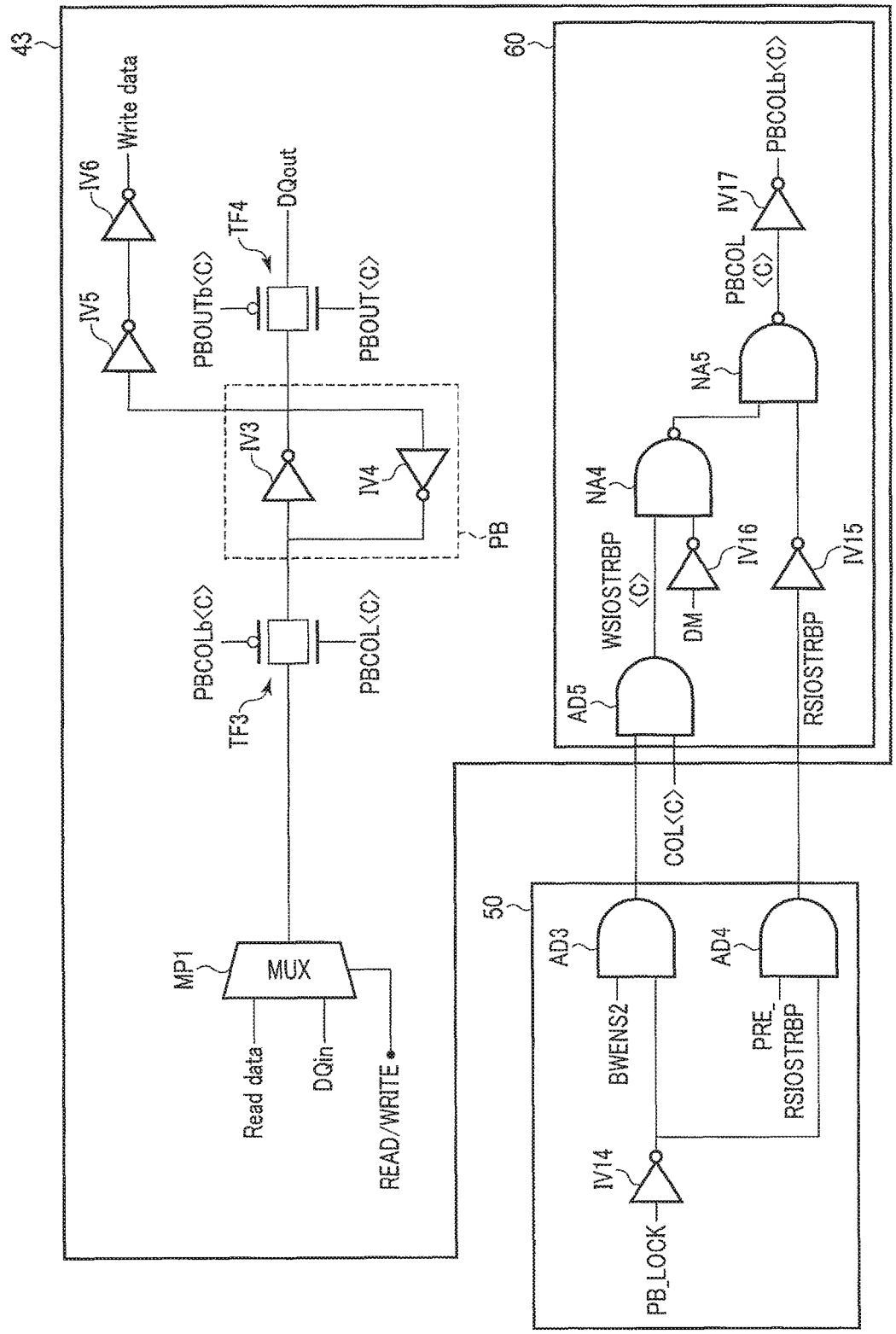
F I G. 19

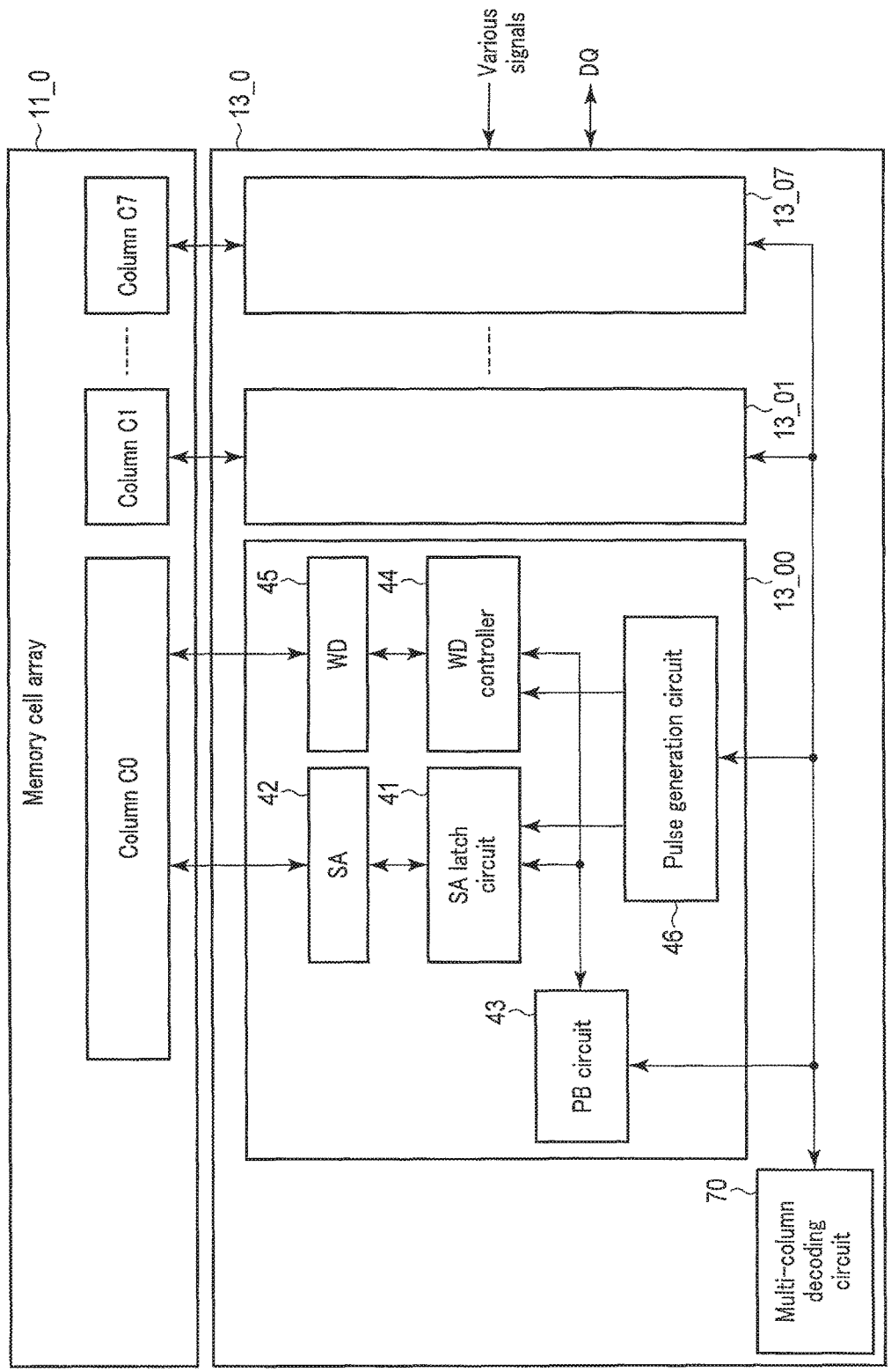
F I G. 22

| SKIP01 | SKIP0 | <000> | <001> | <010> | <011> | <100> | <101> | <110> | <111> |
|---|---|---|---|---|---|---|---|---|---|
| L | L | C0 | C1 | C2 | C3 | C4 | C5 | C6 | C7 |
| L | H | C0, C1 | C0, C1 | C2, C3 | C2, C3 | C4, C5 | C4, C5 | C6, C7 | C6, C7 |
| H | H | C0~C3 | C0~C3 | C0~C3 | C0~C3 | C4~C7 | C4~C7 | C4~C7 | C4~C7 |

Pulse generation circuit for column C0 COL⟨2:0⟩=⟨000⟩
Pulse generation circuit for column C1 COL⟨2:0⟩=⟨001⟩
Pulse generation circuit for column C2 COL⟨2:0⟩=⟨010⟩
Pulse generation circuit for column C3 COL⟨2:0⟩=⟨011⟩
Pulse generation circuit for column C4 COL⟨2:0⟩=⟨100⟩
Pulse generation circuit for column C5 COL⟨2:0⟩=⟨101⟩
Pulse generation circuit for column C6 COL⟨2:0⟩=⟨110⟩
Pulse generation circuit for column C7 COL⟨2:0⟩=⟨111⟩

SEMICONDUCTOR MEMORY DEVICE AND METHOD OF READ/WRITE OPERATION FOR VARIABLE RESISTANCE ELEMENTS

CROSS-REFERENCE TO RELATED APPLICATIONS

This application is based upon and claims the benefit of priority from the prior Japanese Patent Application No. 2017-054726, filed Mar. 21, 2017, the entire contents of which are incorporated herein by reference.

FIELD

Embodiments described herein relate generally to a semiconductor memory device.

BACKGROUND

Magnetic Random Access Memory (MRAM) is a memory device using a memory element having a magnetoresistance effect in a memory cell for storing information. MRAM has attracted attention as a next-generation memory device featuring high-speed operation, large capacity, and nonvolatility.

BRIEF DESCRIPTION OF THE DRAWING

FIG. 4 is a block diagram showing a memory cell array and a read/write circuit in the semiconductor memory device according to the first embodiment;

FIG. 5 is a circuit diagram showing a sense amplifier latch circuit in the semiconductor memory device according to the first embodiment;

FIG. 6 is a circuit diagram showing a page buffer circuit in the semiconductor memory device according to the first embodiment;

FIG. 7 is a circuit diagram showing a write driver controller in the semiconductor memory device according to the first embodiment;

FIG. 8 is a block diagram showing a pulse generation circuit in the semiconductor memory device according to the first embodiment;

FIG. 9 is a circuit diagram showing a latch circuit in the semiconductor memory device according to the first embodiment;

FIG. 10 is a flowchart of write operation of the semiconductor memory device according to the first embodiment;

FIG. 14 is a view showing operation according to various signals of the latch circuit in the semiconductor memory device according to the first embodiment;

FIG. 15 is a view showing operation of the latch circuit during the write operation in a multi-write mode of the semiconductor memory device according to the first embodiment;

FIG. 16 is a circuit diagram showing a latch circuit in a semiconductor memory device according to a second embodiment;

FIG. 17 is a view showing operation according to various signals of the latch circuit in the semiconductor memory device according to the second embodiment;

FIG. 18 is a block diagram showing a memory cell array and a read/write circuit in a semiconductor memory device according to a third embodiment;

FIG. 19 is a block diagram showing a page buffer lock circuit and a page buffer circuit in the semiconductor memory device according to the third embodiment;

FIG. 22 is a block diagram showing a memory cell array and a read/write circuit in a semiconductor memory device according to a fourth embodiment;

FIG. 24 is a view showing operation according to various signals of the multi-column decoding circuit in the semiconductor memory device according to the fourth embodiment;

FIG. 26 is a view showing the operation of the multi-column decoding circuit at the time of decoding in the semiconductor memory device according to the fourth embodiment.

DETAILED DESCRIPTION

Figure 1:
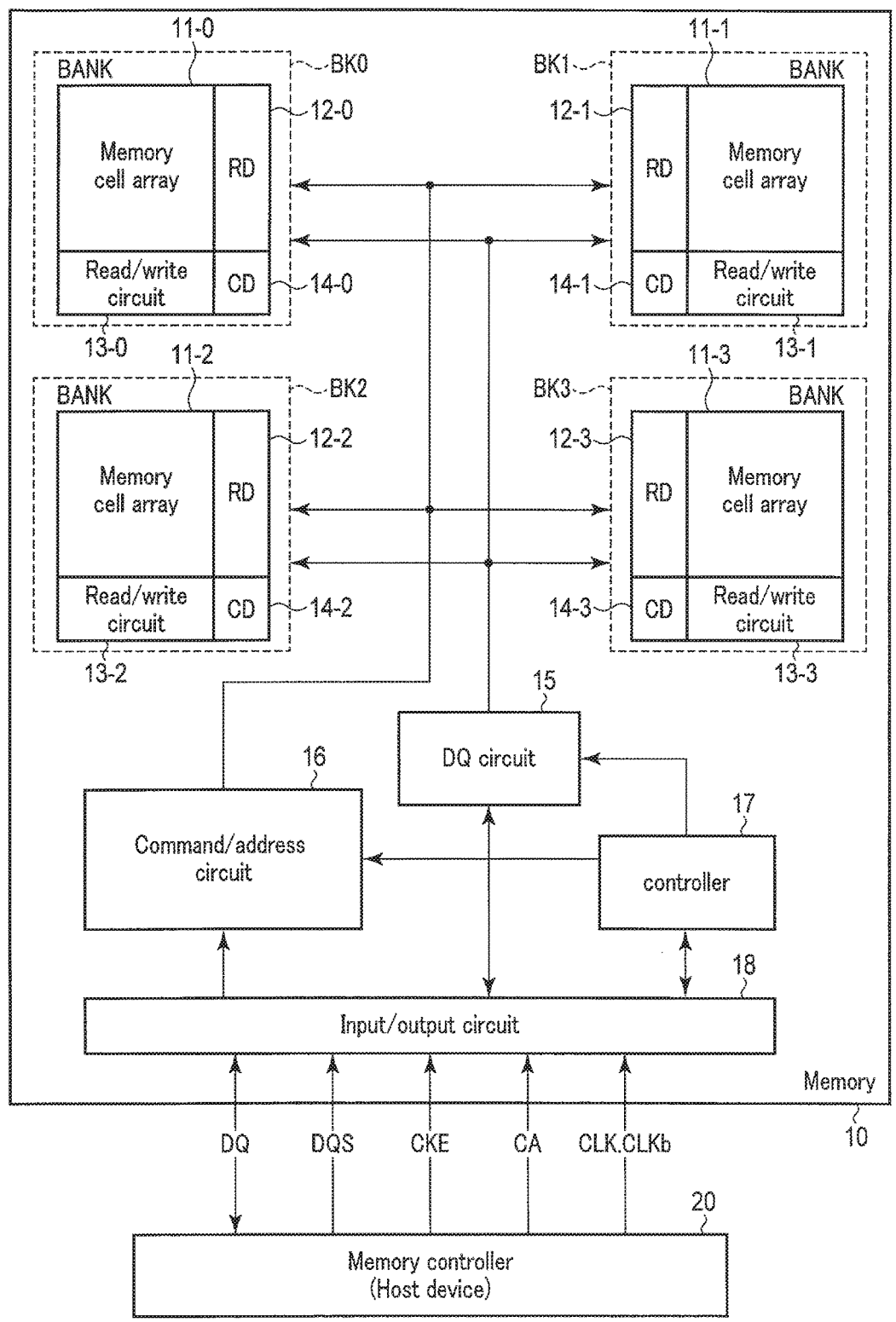
FIG. 1 is a block diagram showing a semiconductor memory device according to a first embodiment.

In general, according to one embodiment, a semiconductor memory device includes a first memory cell having a first variable resistance element, a second memory cell having a second variable resistance element, and a first circuit which controls writing to the first memory cell and the second memory cell. The first circuit receives a first command instructing writing to the first memory cell, after receiving the first command, receives a second command instructing writing to the second memory cell, and after receiving the second command, performs writing to the second memory cell when performing writing to the first memory cell.

Embodiments will be described below with reference to the drawings. Referring to the drawings, like numbers indicate like parts throughout the views.

First Embodiment

Hereinafter, a semiconductor memory device according to the first embodiment will be described with reference to FIGS. 1 to 15. Hereinafter, an MRAM that stores data using a magnetoresistance effect element (Magnetic Tunnel Junction (MTJ) element) as a variable resistance element will be described as an example, but the present invention is not limited thereto. This embodiment can be applied to memories in general in which resistance difference of a variable resistance element is converted into a current difference or voltage difference and sensed.

In the following description, "coupling" includes not only direct coupling but also coupling via an arbitrary element unless otherwise specified. A first terminal of a transistor indicates one of a source and a drain, and a second terminal of the transistor indicates the other of the source and the drain. Further, a control terminal of the transistor indicates a gate. In each signal, a signal b indicates an inverted signal. In each signal, a signal <C> is a signal for a predetermined column address.

Configuration Example of First Embodiment

FIG. 1 is a block diagram showing the semiconductor memory device according to the first embodiment.

As shown in FIG. 1, the semiconductor memory device includes a memory 10 and a memory controller (host device) 20.

The memory 10 is, for example, MRAM, Dynamic Random Access Memory (DRAM), Resistive Random Access Memory (ReRAM), or Phase Change Random Access Memory (PCRAM). The following description is based on an example of the memory 10 being an MRAM.

The memory 10 receives a command/address signal CA, data DQ, a data strobe signal DQS, a clock enable signal CKE, and clocks CLK and CLKb from the memory controller 20. The memory 10 transmits the data DQ to the memory controller 20.

The memory controller 20 includes elements such as Central Processing Unit (CPU), RAM, and Read Only Memory (ROM). The memory controller 20 controls the memory 10 based on a command.

The memory 10 includes banks BK (BK0 to BK3), a data circuit 15, a command/address circuit 16, a controller 17, and an input/output circuit 18.

The bank BK0 has a memory cell array 11_0, a row decoder 12_0, a read/write circuit 13_0, and a column decoder 14_0. The respective bank of banks BK1 to BK3 has a configuration similar to the bank BK0, that is, memory cell arrays 11_1 to 11_3, row decoders 12_1 to 12_3, read/write circuits 13_1 to 13_3, and column decoders 14_1 to 14_3, respectively. Hereinafter, the configuration of the bank BK0 will be described as an example. Here, the bank BK is a maximum activation unit selectable from the memory controller 20.

Figure 2:
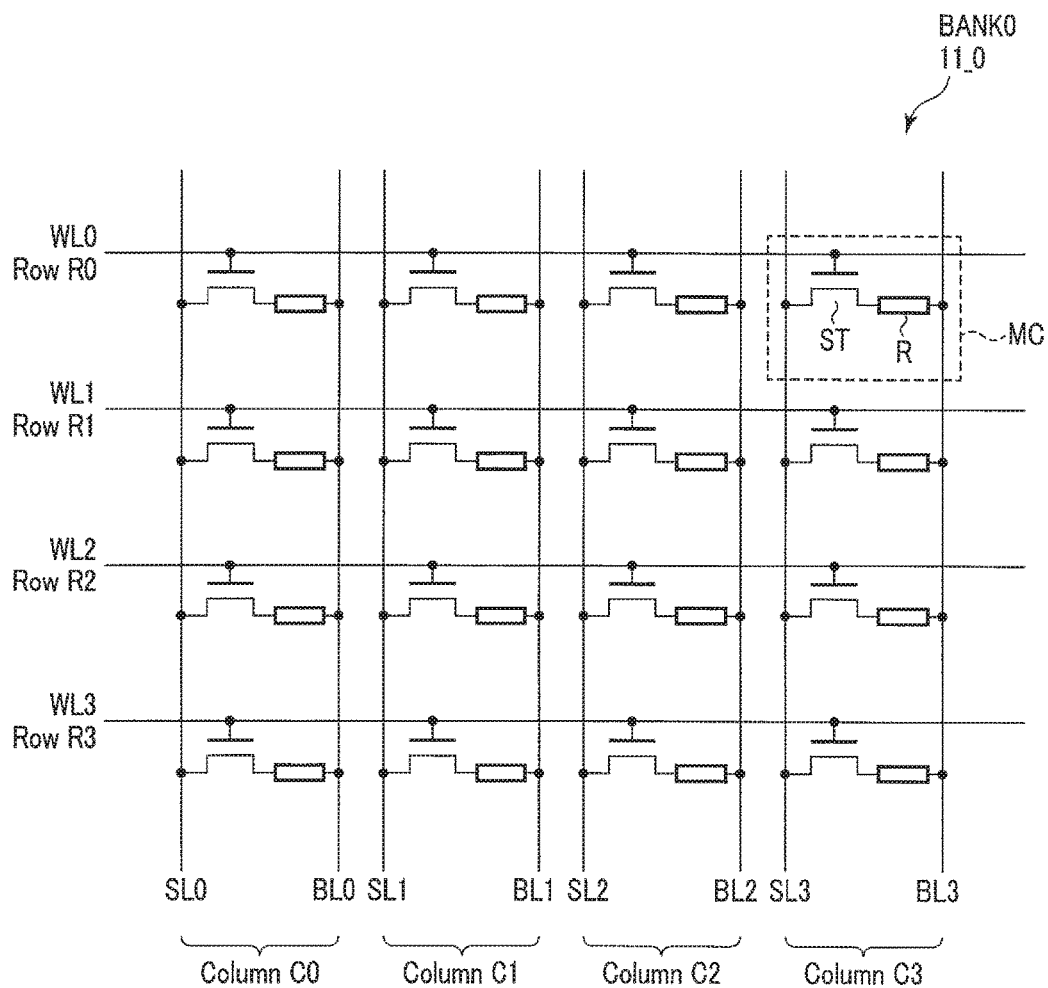
FIG. 2 is a circuit diagram showing a memory cell array of the semiconductor memory device according to the first embodiment.

FIG. 2 is a circuit diagram showing the memory cell array 11_0 of the semiconductor memory device according to the first embodiment.

As shown in FIG. 2, bit lines BL (BL0 to BL3), source lines SL (SL0 to SL3), and word lines WL (WL0 to WL3) are provided in the memory cell array 11_0. The bit line BL and the source line SL extend in a first direction and are alternately arranged in a second direction orthogonal to the first direction. The word line WL extends in the second direction. A memory cell array 11_0 includes a plurality of memory cells MC. Each memory cell MC is provided at each crossing position between the bit line BL and the source line SL and the word line WL. Thus, the plurality of memory cells MC are arranged in a matrix in the first direction and the second direction.

Here, the bit line BL0 and the source line SL0 are referred to as a column C0, the bit line BL1 and the source line SL1 are referred to as a column C1, the bit line BL2 and the source line SL2 are referred to as a column C2, and the bit line BL3 and the source line SL3 are referred to as a column C3. Further, the word line WL0 is referred to as a row R0, the word line WL1 is referred to as a row R1, the word line WL2 is referred to as a row R2, and the word line WL3 is referred to as a row R3. A set of memory cells MC coupled to one word line WL is referred to as a "page".

The number of the columns in the memory cell array 11_0, the number of the bit lines BL, the source lines SL, and the rows in the column, and the number of the word lines WL in the row are just examples and are not limited thereto.

The memory cell MC includes, for example, a variable resistance element R and a selection transistor ST. A first terminal of the variable resistance element R is electrically coupled to the bit line BL, and a second terminal of the variable resistance element R is electrically coupled to a first terminal of the selection transistor ST. A second terminal of the selection transistor ST is electrically coupled to the source line SL, and a control terminal of the selection transistor ST is electrically coupled to the word line WL.

The variable resistance element R is an element whose resistance value changes by applying current (or voltage). The variable resistance element R includes, for example, an MTJ element, a phase change element, and a ferroelectric element. The memory cell MC is selected by the selection transistor ST being turned on by the word line WL. Hereinafter, the case where MRAM, that is, the variable resistance element R is an MTJ element will be described.

Figure 3A:
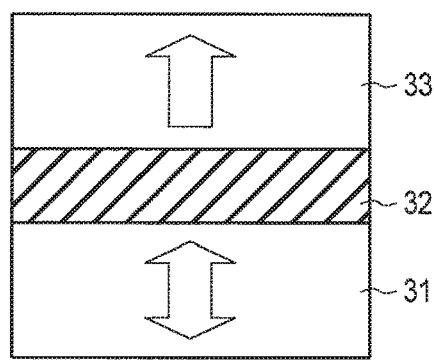
FIG. 3A is a cross-sectional view showing a variable resistance element in the semiconductor memory device according to the first embodiment.

FIG. 3A is a cross-sectional view showing the variable resistance element R in the semiconductor memory device according to the first embodiment. Here, a storage layer 31, a tunnel barrier layer 32, and a reference layer 33 are mainly shown as the variable resistance element R.

As shown in FIG. 3A, the variable resistance element R includes a laminate of the storage layer 31 which is a ferromagnetic layer, the reference layer 33 which is a ferromagnetic layer, and the tunnel barrier layer 32 which is a nonmagnetic layer formed between the storage layer 31 and the reference layer 33.

The storage layer 31 is a ferromagnetic layer whose magnetization direction is variable, and has perpendicular magnetic anisotropy that is vertical or substantially vertical to the film surface (upper surface/lower surface). Here, the variable magnetization direction means that the magnetization direction changes with respect to a predetermined write current. The term "substantially vertical" means that a direction of remanent magnetization is within a range of $45° < \theta \le 90°$ with respect to a film surface. The storage layer 31 is formed of, for example, cobalt iron boron (CoFeB) or iron boride (FeB).

The tunnel barrier layer 32 is formed on the storage layer 31. The tunnel barrier layer 32 is a nonmagnetic layer, and is formed of, for example, MgO.

The reference layer 33 is formed on the tunnel barrier layer 32. The reference layer 33 is a ferromagnetic layer whose magnetization direction is invariant, and has perpendicular magnetic anisotropy that is vertical or substantially vertical to the film surface. Here, the invariant magnetization direction means that the magnetization direction does not change with respect to a predetermined write current. That is, in the reference layer 33, an inversion energy barrier in the magnetization direction is larger than that of the storage layer 31. The reference layer 33 is formed of, for example, cobalt platinum (CoPt), cobalt nickel (CoNi), or cobalt palladium (CoPd).

Figure 3B:
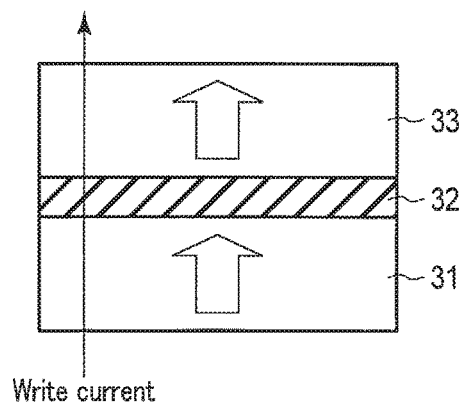
FIG. 3B is a view for explaining writing in the variable resistance element in the semiconductor memory device according to the first embodiment and showing a cross-sectional view of the variable resistance element in a parallel state (P state)
Figure 3C:
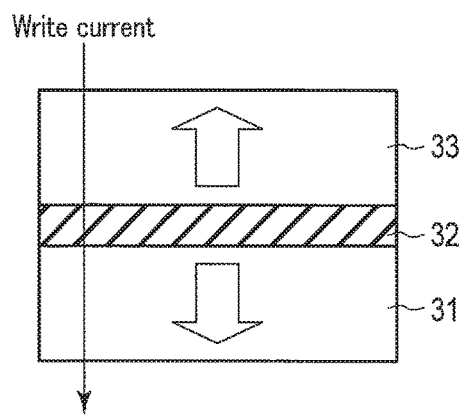
FIG. 3C is a view for explaining writing in the variable resistance element in the semiconductor memory device according to the first embodiment and showing a cross-sectional view of the variable resistance element in an anti-parallel state (AP state)

FIG. 3B is a view for explaining writing in the variable resistance element R in the semiconductor memory device according to the first embodiment and showing a cross-sectional view of the variable resistance element in a parallel state (P state). FIG. 3C is a view for explaining writing in the variable resistance element R in the semiconductor memory device according to the first embodiment and showing a cross-sectional view of the variable resistance element in an anti-parallel state (AP state).

The variable resistance element R is, for example, a spin transfer type variable resistance element. Therefore, when data is written to the variable resistance element R, or when data is read from the variable resistance element R, the variable resistance element R is energized bi-directionally in a direction vertical to the film surface.

More specifically, writing of data to the variable resistance element R is performed as follows.

As shown in FIG. 3B, when a current flows from the storage layer 31 to the reference layer 33, that is, when electrons traveling from the reference layer 33 toward the storage layer 31 are supplied, spin-polarized electrons are injected into the storage layer 31 in the same direction as the magnetization direction of the reference layer 33. In this case, the magnetization direction of the storage layer 31 is aligned in the same direction as the magnetization direction of the reference layer 33. Consequently, the magnetization direction of the reference layer 33 and the magnetization direction of the storage layer 31 are arranged in parallel. In this parallel state, the resistance value of the variable resistance element R becomes the smallest. This case is defined as "0" data, for example.

On the other hand, as shown in FIG. 3C, when a current flows from the reference layer 33 to the storage layer 31, that is, when electrons traveling from the storage layer 31 toward the reference layer 33 are supplied, the electrons and electrons spin-polarized in an opposite direction as the magnetization direction of the reference layer 33 by being reflected by the reference layer 33, are injected into the storage layer 31. In this case, the magnetization direction of the storage layer 31 is aligned in the opposite direction as the magnetization direction of the reference layer 33. Consequently, the magnetization direction of the reference layer 33 and the magnetization direction of the storage layer 31 are arranged in anti-parallel. In this anti-parallel state, the resistance value of the variable resistance element R becomes the largest. This case is defined as "1" data, for example.

Reading of data from the variable resistance element R is performed as follows.

A read current is supplied to the variable resistance element R. This read current is set to a value (a value smaller than the write current) at which the magnetization direction of the storage layer 31 is not reversed. The "0" data and the "1" data can be read out by detecting the change in the resistance value of the variable resistance element R at this time.

Again, as shown in FIG. 1, the row decoder 12_0 selects the word line WL according to a row address. The column decoder 14_0 selects the bit line BL and the source line SL according to a column address. The read/write circuit 13_0 controls writing to the memory cell array 11_0 and reading from the memory cell array 11_0. Details of the read/write circuit 13_0 will be described later.

The input/output circuit 18 controls transmission of signals to and from the memory controller 20. More specifically, the input/output circuit 18 receives a command/address signal CA, data DQ, a data strobe signal DQS, a clock enable signal CKE, and clocks CLK and CLKb from the memory controller 20. Then, the input/output circuit 18 supplies the command/address signal CA, the clock enable signal CKE, and the clock CLK/CLKb, received from the memory controller 20, to the command/address circuit 16. Further, the input/output circuit 18 transfers the data DQ from the memory controller 20 to the data circuit 15 and transfers the data DQ from the data circuit 15 to the memory controller 20. Furthermore, the input/output circuit 18 supplies various control signals to the controller 17.

The command/address circuit 16 receives the command/address signal CA and the clock enable signal CKE from the input/output circuit 18 and supplies signals based on them to the banks BK0 to BK3. Further, the command/address circuit 16 receives the clocks CLK and CLKb from the input/output circuit 18 and outputs various signals at timings based on the clocks CLK and CLKb.

The data circuit 15 transfers the data DQ from the input/output circuit 18 to the bank BK and transfers the data DQ from the bank BK to the input/output circuit 18.

The controller 17 includes elements such as a voltage generation circuit and controls each constituent element based on a control signal from the input/output circuit 18.

FIG. 4 is a block diagram showing the memory cell array 11_0 and the read/write circuit 13_0 in the semiconductor memory device according to the first embodiment. Here, an example in which the memory cell array 11_0 includes the columns C0 to C7 is shown.

As shown in FIG. 4, the read/write circuit 13_0 includes first to eighth read/write circuits 13_00 to 13_07. The first to eighth read/write circuits 13_00 to 13_07 are coupled to the respective columns C0 to C7 and control writing and reading of the respective columns C0 to C7. The first to eighth read/write circuits 13_00 to 13_07 have the same configuration. Here, the configuration of the first read/write circuit 13_00 will be described as an example.

The first read/write circuit 13_00 includes a sense amplifier latch circuit 41, a sense amplifier 42, a page buffer circuit 43, a write driver controller 44, a write driver 45, and a pulse generation circuit 46.

The sense amplifier 42 senses a read current or a read voltage applied to the memory cell MC and transmits the result (read data) to the sense amplifier latch circuit 41. The sense amplifier latch circuit 41 receives the read data from the sense amplifier 42 and temporarily stores the read data. The sense amplifier latch circuit 41 temporarily stores write data from the page buffer circuit 43.

The page buffer circuit 43 temporarily stores write data to the memory cell MC and read data from the memory cell MC (sense amplifier latch circuit 41).

The pulse generation circuit 46 generates a write pulse at the time of writing.

The write driver controller 44 compares data of the sense amplifier latch circuit 41 with data of the page buffer circuit 43. Further, the write driver controller 44 executes a write operation in response to the write pulse from the pulse generation circuit 46.

In accordance with the write driver controller 44, the write driver 45 applies a write voltage to the bit line BL and the source line SL to supply a write current to the memory cell MC.

Each constituent element will be described in detail below.

FIG. 5 is a circuit diagram showing the sense amplifier latch circuit 41 in the semiconductor memory device according to the first embodiment.

As shown in FIG. 5, the sense amplifier latch circuit 41 includes transfer gates TF1 and TF2 and a latch (hereinafter referred to as a sense amplifier latch) SAL.

A signal (read data) from the memory cell array 11_0 is input to the transfer gate TF1 via the sense amplifier 42. The output of the transfer gate TF1 is input to the sense amplifier latch SAL (inverter IV1). The transfer gate TF1 is constituted of a PMOS transistor and an NMOS transistor, the first terminal of which is an input and the second terminal of which is an output. A signal RLEN is supplied to a control terminal of the NMOS transistor, and a signal RLENb is supplied to a control terminal of the PMOS transistor.

A signal Write Data (signal based on write data) from the page buffer circuit 43 (inverter IV6) is input to the transfer gate TF2. The output of the transfer gate TF2 is input to the sense amplifier latch SAL (inverter IV1). The transfer gate TF2 is constituted of a PMOS transistor and an NMOS transistor, the first terminal of which is an input and the second terminal of which is an output. A signal WSTR is supplied to a control terminal of the NMOS transistor, and a signal WSTRb is supplied to a control terminal of the PMOS transistor.

The sense amplifier latch SAL includes inverters IV1 and IV2. The inputs and outputs of the inverters IV1 and IV2 are electrically coupled to each other. The outputs of the transfer gates TF1 and TF2 are input to the inverter IV1 (sense amplifier latch SAL). That is, a signal based on the read data from the memory cell MC is transferred to the sense amplifier latch SAL via the transfer gate TF1, and a signal based on the write data from the page buffer PB is transferred to the sense amplifier latch SAL via the transfer gate TF2. The output of the inverter IV1 (output of sense amplifier latch SAL) becomes a signal Read Data (signal based on read data).

FIG. 6 is a circuit diagram showing the page buffer circuit 43 in the semiconductor memory device according to the first embodiment.

As shown in FIG. 6, the page buffer circuit 43 includes a multiplexer MP1, transfer gates TF3 and TF4, a latch (hereinafter referred to as a page buffer) PB, and inverters IV5 and IV6.

The signal Read Data from the sense amplifier latch circuit 41 (inverter IV1) and a signal DQin (write data) from the data circuit 15 are input to the multiplexer MP1. Further, a signal READ/WRITE is input to the multiplexer MP1. The multiplexer MP1 selects the signal Read Data when the signal READ is input and selects the signal DQin when the signal WRITE is input. The output of the multiplexer MP1 is input to the transfer gate TF3.

The output of the transfer gate TF3 is input to the page buffer PB. The transfer gate TF3 is constituted of a PMOS transistor and an NMOS transistor, the first terminal of which is an input and the second terminal of which is an output. A signal PBCOL<C> is supplied to a control terminal of the NMOS transistor, and a signal PBCOLb<C> is supplied to a control terminal of the PMOS transistor.

The page buffer PB includes inverters IV3 and IV4. The inputs and outputs of the inverters IV3 and IV4 are electrically coupled to each other. The output of the transfer gate TF3 is input to the inverter IV3 (page buffer PB). That is, a signal based on the write data or a signal based on the read data is transferred to the page buffer PB via the transfer gate TF3. The output of the inverter IV3 (output of page buffer PB) is input to the transfer gate TF4 and the inverter IV5.

The output of the inverter IV5 is input to the inverter IV6. The output of the inverter IV6 becomes the signal Write Data.

The output of the transfer gate TF4 becomes a signal DQout. The transfer gate TF4 is constituted of a PMOS transistor and an NMOS transistor, the first terminal of which is an input and the second terminal of which is an output. A signal PBOUT<C> is supplied to a control terminal of the NMOS transistor, and a signal PBOUTb<C> is supplied to a control terminal of the PMOS transistor.

FIG. 7 is a circuit diagram showing the write driver controller 44 in the semiconductor memory device according to the first embodiment.

As shown in FIG. 7, the write driver controller 44 includes an exclusive OR gate EO1, NAND gates NA1 and NA2, and inverters IV7 and IV8.

The signal Read Data from the sense amplifier latch 41 (inverter IV1) and the signal Write Data from the page buffer 43 (inverter IV6) are input to the exclusive OR gate EO1. The output of the exclusive OR gate EO1 becomes a signal DIFF. The exclusive OR gate EO1 sets the signal DIFF to the "H" level when the signal Read Data and the signal Write Data are different, and sets the signal DIFF to the "L" level when the signal Read Data and the signal Write Data are the same.

The signal DIFF, a signal WRITE_PULSE from the pulse generation circuit 46 (SR latch circuit 46G), and the signal Write Data from the page buffer 43 (inverter IV6) are input to the NAND gate NA1. The output of the NAND gate NA1 is input to the inverter IV7. The output of the inverter IV7 is input to the write driver 45 on the bit line BL side.

The signal DIFF, the signal WRITE_PULSE from the pulse generation circuit 46 (SR latch circuit 46G), and a signal Write Data_b are input to the NAND gate NA2. The output of the NAND gate NA2 is input to the inverter IV8. The output of the inverter IV8 is input to the write driver 45 on the source line SL side.

FIG. 8 is a block diagram showing the pulse generation circuit 46 in the semiconductor memory device according to the first embodiment.

As shown in FIG. 8, the pulse generation circuit 46 includes a reset circuit 46A, a latch circuit 46B, shift registers 46C and 46D, delay circuits 46E and 46F, an SR latch circuit 46G, a driver 46H, AND gates AD1 and AD2, and multiplexers MP2 to MP4.

Signals BWEN2<C> and RESET are input to the reset circuit 46A. The output of the reset circuit 46A becomes a signal WARST.

Signals WARST, COL<C> and TMULT_UWTC are input to the latch circuit 46B. Further, a signal BWENS (clock CLK) is input to the latch circuit 46B. Here, the signal COL<C> is a signal based on a write command of a corresponding column address. The signal TMULT_UWTC is a signal based on a mode register write (MRW) command in a multi-write mode. The output A0<C> of the latch circuit 46B is input to the shift register 46C. Details of the latch circuit 46B will be described later with reference to FIG. 9.

A signal BWEN_EN<0> (clock CLK) is further input to the shift register 46C. The output A1<C> of the shift register 46C is input to the shift register 46D as an output An−1<C> after passing through a plurality of shift registers. A signal BWEN_EN<n−1> (clock CLK) is further input to the shift register 46D. The shift register 46D provides the output An<C>.

The signal BWENS is input to the delay circuit 46E. The output of the delay circuit 46E is input to the multiplexer MP2.

The output of the delay circuit 46E and the signal BWENS_TUWTC are input to the multiplexer MP2. Further, a signal TUWTC is input to the multiplexer MP2. The signal BWENS_TUWTC is a signal based on the clock enable signal CKE. The signal TUWTC is a signal based on an MRW command in a test write mode. The multiplexer MP2 selects the signal BWENS_TUWTC when the signal TUWTC is at the "H" level (in the test write mode). The output of the multiplexer MP2 becomes a signal BWENSd.

The signal BWENSd and the output A0<C> are input to the AND gate AD1. The output of the AND gate AD1 becomes a signal WAYTS.

The signal BWEN_EN<n−1> is input to the delay circuit 46F. The output of the delay circuit 46F is input to the multiplexer MP3.

The output of the delay circuit 46F and a signal BWENE_TUWTC are input to the multiplexer MP3. Further, the signal TUWTC is input to the multiplexer MP2. The signal BWENE_TUWTC is a signal based on the clock enable signal CKE. The multiplexer MP3 selects the signal BWENE_TUWTC when the signal TUWTC is at the "H" level (in the test write mode). The output of the multiplexer MP3 becomes a signal BWENEd.

The outputs A0<C> and An<C> are input to the multiplexer MP3. Further, the signal TUWTC is input to the multiplexer MP3. The multiplexer MP3 selects the output A0<C> when the signal TUWTC is at the "H" level. The multiplexer MP3 provides the output Ad<C>.

The signal BWENEd and the output Ad<C> are input to the AND gate AD2. The output of the AND gate AD2 becomes a signal WAYTE<C>.

A signal WAYTS<C> and the signal WAYTE<C> are input to the SR latch circuit 46G. The output of the SR latch circuit 46G becomes a signal WRITE_PULSE<C>.

The signal WAYTE<C> is input to the driver 46H. The output of the driver 46H becomes a signal WSTR<C>.

FIG. 9 is a circuit diagram showing the latch circuit 46B in the semiconductor memory device according to the first embodiment.

The latch circuit 46B includes a NAND gate NA3, NOR gates NO1 and NO2, and inverters IV9 to IV13.

A signal TMULTI_UWTC and the output A0<C> are input to the NAND gate NA3. The output of the NAND gate NA3 is input to the inverter IV9. The output of the inverter IV9 is input to the NOR gate NO1.

The output of the inverter IV9 and the signal COL<C> are input to the NOR gate NO1. The output of the NOR gate NO1 is input to the inverter IV10. The output of the inverter IV10 is input to the inverter IV12.

To the inverter IV12, the output of the inverter IV10 is input, and, at the same time, the signal BWENS and an inverted signal of the signal BWENS via the inverter IV11 are input. The inverter IV12 inverts and outputs the input from the inverter IV10 when the signal BWENS is at the "H" level, and does not output the input from the inverter IV10 when a signal is at the "H" level. The output of the inverter IV12 is input to the NOR gate NO2.

The output of the inverter IV12 and the signal WARST are input to the NOR gate NO2. The NOR gate NO2 provides the output A0<C>. The output A0<C> is fed back to the NAND gate NA3. Further, the output A0<C> is fed back to the NOR gate NO2 via the inverter IV13. The output of the inverter IV13 is input to the same terminal as the output of the inverter IV12.

Example of Write Operation in First Embodiment

FIG. 10 is a flowchart of write operation of the semiconductor memory device according to the first embodiment. Here, a test mode (write test mode) of the write operation will be described as an example.

As shown in FIG. 10, first, in step S11, the command/address circuit 16 receives the MRW command for the write test mode. The MRW command is a command for switching modes. Consequently, the write test mode is set. The write test mode is a mode for checking whether data is normally written in a selected memory cell.

Then, in step S12, the command/address circuit 16 receives the MRW command for the multi-write mode. Thus, the multi-write mode is set. The multi-write mode is a mode in which the write operation is simultaneously performed for memory cells of a plurality of column addresses. That is, the multi-write mode is a mode in which writing is performed once in response to a plurality of write commands.

Then, in step S13, the command/address circuit 16 receives an active command. The active command includes a row address R. Here, the row R0 is selected. Consequently, the selected row R0 is activated.

Then, in step S14, the command/address circuit 16 receives the first write command. The write command includes a column address C and instructs writing to a predetermined column address C. Here, the column C0 is selected. Consequently, the column C0 is activated as a writing target.

Then, in step S15, the command/address circuit 16 receives the second write command. Here, the column (column C1) next to the previously selected column C0 is selected. Consequently, the column C1 is activated as a writing target.

Then, in step S16, the data circuit 15 receives data. Here, data to be written to the columns C0 and C1 is received.

Then, in step S17, the pulse generation circuit 46 generates a write pulse. Here, the pulse generation circuit 46 of the first read/write circuit 13_00 coupled to the column C0 and the pulse generation circuit 46 of the second read/write circuit 13_01 coupled to the column C1 simultaneously generate write pulses. Consequently, the write operation is performed simultaneously on the columns C0 and C1.

Thereafter, in step S18, the command/address circuit 16 receives a precharge command. Consequently, the write operation is terminated.

Hereinafter, a timing chart of various signals and commands during the write operation shown in FIG. 10 will be described with reference to FIGS. 11 to 13.

Figure 11:
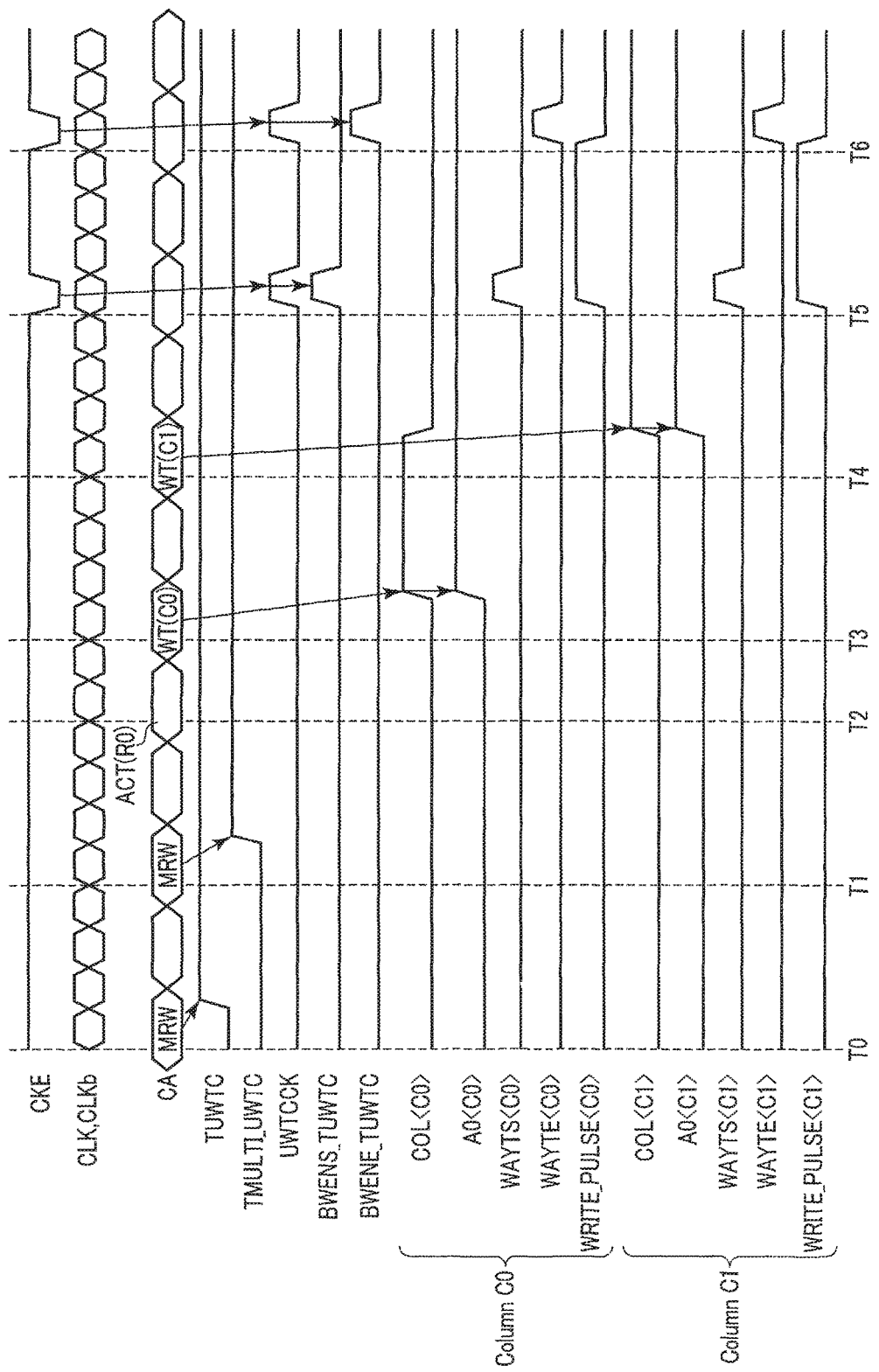
FIG. 11 is a timing chart of various signals and commands in the write operation of the semiconductor memory device according to the first embodiment.

FIG. 11 is a timing chart of various signals and commands in the write operation of the semiconductor memory device according to the first embodiment. As described above, here will be described an example in which the pulse generation circuit 46 (pulse generation circuit 46 for column C0) of the first read/write circuit 13_00 coupled to the column C0 and the pulse generation circuit 46 (pulse generation circuit 46 for column C1) of the second read/write circuit 13_01 coupled to the column C1 simultaneously generate the write pulses.

In this example, the pulse indicates a waveform in which an arbitrary signal changes from the "L" level to the "H" level at an arbitrary time. Accordingly, in this example, the write pulse indicates a waveform in which the signal WRITE_PULSE <C> changes from the "L" level to the "H" level at an arbitrary time. In the following description, an asserted state refers to that an arbitrary signal is at the "H" level, and a negated state refers to that an arbitrary signal is at the "L" level. Further, asserting refers to that an arbitrary signal switches (rises) to the "H" level, and negating refers to that an arbitrary signal switches (falls) to the "L" level.

Figure 12:
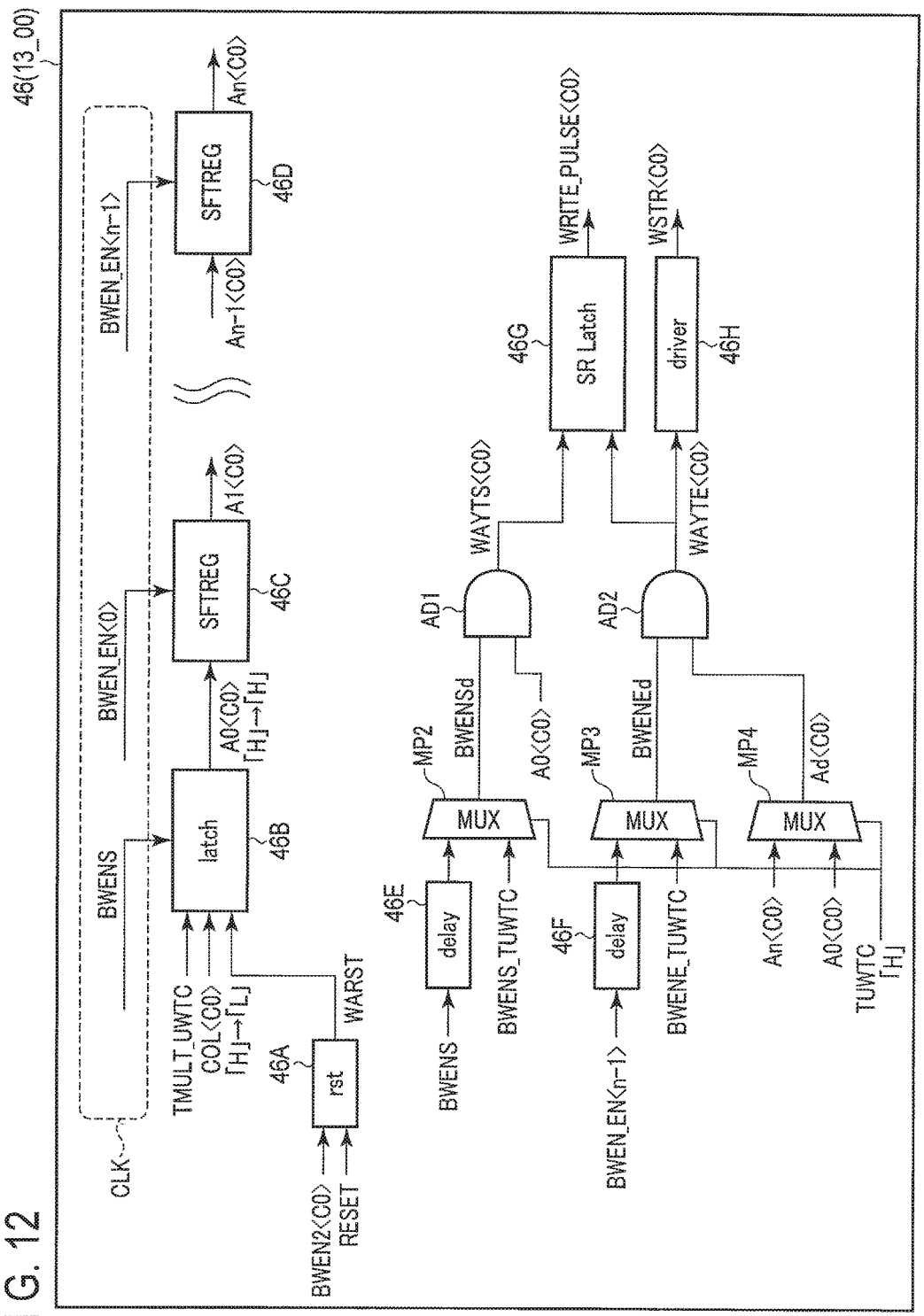
FIG. 12 is a view showing operation of a pulse generation circuit for column C0 during the write operation of the semiconductor memory device according to the first embodiment.
Figure 13:
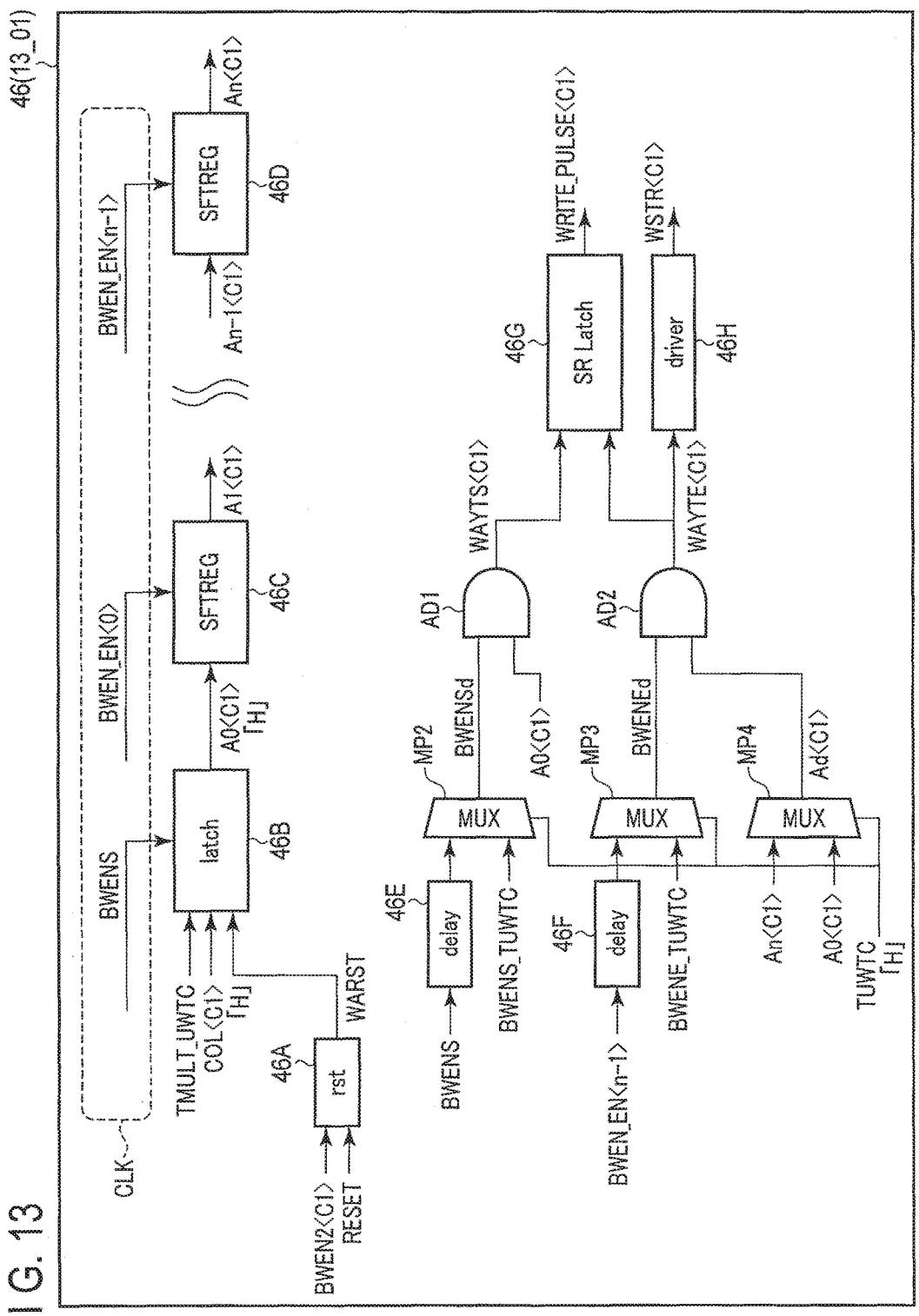
FIG. 13 is a view showing operation of a pulse generation circuit for column C1 during the write operation of the semiconductor memory device according to the first embodiment.

FIG. 12 is a view showing the operation of the pulse generation circuit 46 (pulse generation circuit 46 of first read/write circuit 13_00) for the column C0 during the write operation of the semiconductor memory device according to the first embodiment. FIG. 13 is a view showing the operation of the pulse generation circuit 46 (pulse generation circuit 46 of second read/write circuit 13_01) for the column C1 during the write operation of the semiconductor memory device according to the first embodiment.

In FIG. 11, the clock enable signal CKE, the clock CLK/CLKb, and the command/address signal CA are signals supplied from the outside (memory controller 20). On the other hand, other signals than the above signals are signals generated inside the memory 10. Signals COL<C0>, A0<C0>, WAYTS<C0>, WAYTE<C0> and WRITE_PURSE<C0> are signals of the pulse generation circuit 46 for the column C0, and signals COL<C1>, A0<C1>, WAYTS<C1>, WAYTE<C1>, and WRITE_PURSE<C1> are signals of the pulse generation circuit 46 for the column C1. The signals TUWTC, TMULTI_UWTC, UWTCCK, BWENS_TUWTC, and BWENE_TUWTC are signals shared by the pulse generation circuit 46 for the column C0 and the pulse generation circuit 46 for the column C1.

In this example, firstly, the column C0 is selected by the first write command. Consequently, the latch circuit 46B in the pulse generation circuit 46 for the column C0 sets the output A0<C0> to the "H" level. Subsequently, the column C1 is selected by the second write command. Consequently, the latch circuit 46B in the pulse generation circuit 46 for the column C1 sets the output A0<C1> to the "H" level. At this time, the latch circuit 46B in the pulse generation circuit 46 for the column C0 maintains the output A0<C0> at the "H" level. Since both the output A0<C0> for the column C0 and the output A<C1> for the column C1 are at the "H" level, write pulses can be generated simultaneously for the column C0 and the column C1 based on the subsequent clock enable signal CKE.

Hereinafter, generation of write pulses (signals WRITE_PULSE<C0>, WRITE_PULSE<C1>) for a plurality of columns (columns C0, C1) will be described in detail.

As shown in FIG. 11, in an initial state, the clock enable signal CKE is at the "H" level, and the other signals are at the "L" level. Firstly, at time T0, the command/address circuit 16 receives the MRW command for the write test mode. The command/address circuit 16 sets the signal TUWTC to the "H" level based on the reception of the MRW command for the write test mode. That is, as shown in FIGS. 12 and 13, in the pulse generation circuit 46 for the column C0 and the pulse generation circuit 46 for the column C1, the signal TUWTC at the "H" level is input to the multiplexers MP2 to MP4. Consequently, the multiplexer MP2 selects the input of the signal BWENS_TU-WTC, the multiplexer MP3 selects the input of the signal BWENE_TUWTC, and the multiplexer MP4 selects the input of the output A0<C0>.

Then, as shown in FIG. 11, at time T1, the command/address circuit 16 receives the MRW command for the multi-write mode. The command/address circuit 16 sets the signal TMULTI_UWTC to the "H" level based on the reception of the MRW command for the multi-write mode. That is, as shown in FIGS. 12 and 13, in the pulse generation circuit 46 for the column C0 and the pulse generation circuit 46 for the column C1, the signal TMULTI_UWTC at the "H" level is input to the latch circuit 46B.

Then, as shown in FIG. 11, at time T2, the command/address circuit 16 receives the active command. The active command includes the row address R. Here, the row R0 is selected. Consequently, the selected row R0 is activated.

Then, as shown in FIG. 11, at time T3, the command/address circuit 16 receives the first write command. The write command includes the column address C. Here, the column C0 is selected. Consequently, the command/address circuit 16 sets the signal COL<C0> to the "H" level. That is, as shown in FIG. 12, the signal COL<C0> at the "H" level is input to the latch circuit 46B in the pulse generation circuit 46 for the column C0. The latch circuit 46B sets the output A0<C0> to the "H" level based on the signal COL<C0> at the "H" level.

Then, as shown in FIG. 11, at time T4, the command/address circuit 16 receives the second write command. The write command includes the column address C. Here, the column C1 is selected. Consequently, the command/address circuit 16 sets the signal COL<C1> to the "H" level. That is, as shown in FIG. 13, the signal COL<C1> at the "H" level is input to the latch circuit 46B in the pulse generation circuit 46 for the column C1. The latch circuit 46B sets the output A0<C1> to the "H" level based on the signal COL<C1> at the "H" level.

On the other hand, as the column C1 is selected, the signal COL<C0> becomes the "L" level. That is, as shown in FIG. 12, the signal COL<C0> at the "L" level is input to the latch circuit 46B in the pulse generation circuit 46 for the column C0. At this time, the latch circuit 46B maintains the output A0<C0> at the "H" level irrespective of the level of the signal COL<C0>. Details of the operation of the latch circuit 46B will be described later with reference to FIGS. 14 and 15.

Then, as shown in FIG. 11, at time T5, the clock enable signal CKE becomes the "L" level. At this time, the clock enable signal CKE becomes the "L" level for a predetermined time (short time). The command/address circuit 16 sets the signal UWTCCK to the "H" level for a predetermined time based on the clock enable signal CKE at the "L" level. Then, the command/address circuit 16 sets the signal BWENS_TUWTC to the "H" level for a predetermined time based on the first "H" level of the signal UWTCCK.

That is, as shown in FIG. 12, in the pulse generation circuit 46 for the column C0, the signal BWENS_TUWTC at the "H" level is input to the multiplexer MP2. As described above, the multiplexer MP2 sets the signal BWENSd to the "H" level for a predetermined time in order to select the signal BWENS_TUWTC. Consequently, as shown in FIG. 11, the AND circuit AD1 sets the signal WAYTS<C0> to the "H" level for a predetermined time by the signal BWENSd at the "H" level and A0<C0> at the "H" level. Then, the SR latch circuit 46G sets the signal WRITE_PULSE<C0> to the "H" level based on the rise (assertion) of WAYTS<C0> (triggering the assertion).

Accordingly, the assertion of the signal WRITE_PULSE<C0> is based on the first fall (negation) of the clock enable signal CKE.

On the other hand, the same operation is performed also in the pulse generation circuit 46 for the column C1. That is, as shown in FIG. 13, in the pulse generation circuit 46 for the column C1, the signal BWENS_TUWTC at the "H" level is input to the multiplexer MP2. As described above, the multiplexer MP2 sets the signal BWENSd to the "H" level for a predetermined time in order to select the signal BWENS_TUWTC. Consequently, as shown in FIG. 11, the AND circuit AD1 sets the signal WAYTS<C1> to the "H" level for a predetermined time by the signal BWENSd at the "H" level and A0<C1> at the "H" level. Then, the SR latch circuit 46G sets the signal WRITE_PULSE<C1> to the "H" level based on the assertion of WAYTS<C1> (triggering the assertion). Accordingly, similarly to the signal WRITE_PULSE<C0>, the assertion of the signal WRITE_PULSE<C1> is based on the first negation of the clock enable signal CKE.

Then, as shown in FIG. 11, at time T6, the clock enable signal CKE becomes the "L" level again for a predetermined time. The command/address circuit 16 sets the signal UWTCCK to the "H" level for a predetermined time based on the clock enable signal CKE at the "L" level. Then, the command/address circuit 16 sets the signal BWENE_TUWTC to the "H" level for a predetermined time based on the second "H" level of the signal UWTCCK.

That is, as shown in FIG. 12, in the pulse generation circuit 46 for the column C0, the signal BWENE_TUWTC at the "H" level is input to the multiplexer MP3. As described above, the multiplexer MP3 sets the signal BWENEd to the "H" level for a predetermined time in order to select the signal BWENE_TUWTC. On the other hand, the multiplexer MP4 sets Ad<C0> to the "H" level in order to select the signal A0<C0>. Consequently, as shown in FIG. 11, the AND circuit AD2 sets the signal WAYTE<C0> to the "H" level for a predetermined time by the signal BWENEd at the "H" level and Ad<C0> at the "H" level. Then, the SR latch circuit 46G sets the signal WRITE_PULSE<C0> to the "L" level based on the assertion of WAYTE<C0> (triggering the assertion). Accordingly, the negation of the signal WRITE_PULSE<C0> is based on the second negation of the clock enable signal CKE.

On the other hand, the same operation is performed also in the pulse generation circuit 46 for the column C1. That is, as shown in FIG. 13, in the pulse generation circuit 46 for the column C1, the signal BWENE_TUWTC at the "H" level is input to the multiplexer MP3. As described above, the multiplexer MP3 sets the signal BWENEd to the "H" level for a predetermined time in order to select the signal BWENE_TUWTC. On the other hand, the multiplexer MP4 sets Ad<C1> to the "H" level in order to select the signal A0<C1>. Consequently, as shown in FIG. 11, the AND circuit AD2 sets the signal WAYTE<C1> to the "H" level for a predetermined time by the signal BWENEd at the "H" level and Ad<C1> at the "H" level. Then, the SR latch circuit 46G sets the signal WRITE_PULSE<C1> to the "L" level based on the assertion of WAYTE<C1> (triggering the assertion). Accordingly, similarly to the signal WRITE_PULSE<C0>, the negation of the signal WRITE_PULSE<C1> is based on the second negation of the clock enable signal CKE.

As described above, both the signals WRITE_PULSE<C0> and WRITE_PULSE<C1> assert based on the first toggle (negation) of the clock enable signal CKE, and negate based on the second toggle (negation) of the clock enable signal CKE. In other words, write pulses of the column C0 and the column C1 are generated based on the two toggles of the clock enable signal CKE.

Hereinafter, the operation of the latch circuit 46B during the write operation shown in FIG. 11 will be described with reference to FIGS. 14 and 15.

FIG. 14 is a view showing operation according to various signals of the latch circuit 46B in the semiconductor memory device according to the first embodiment.

As shown in FIG. 14, when the signal TMULTI_UWTC is at the "L" level, the latch circuit 46B is driven as a normal write mode. At this time, when the signal WARST (based on signal RESET and signal BWEN2<C>) is at the "L" level and the signal BWENS (based on clock CLK) is at the "L" level, the level of the output A0<C> is maintained irrespective of the level of the signal COL<C>. When the signal WARST is at the "L" level and the signal BWENS is at the "H" level, the level of the output A0<C> is rewritten to the level of the signal COL<C>. On the other hand, when the signal WARST becomes the "H" level, the level of the output A0<C> is reset to become the "L" level.

When the signal TMULTI_UWTC is at the "H" level, the latch circuit 46B is driven as the multi-write mode. At this time, when the signal WARST is at the "L" level and the signal BWENS is at the "L" level, the level of the output A0<C> is maintained irrespective of the level of the signal COL<C>. When the signal WARST is at the "L" level and the signal BWENS is at the "H" level, the output changes depending on the level of the output A0<C>. At this time, if the output A0<C> is at the "L" level, the level of the output A0<C> is rewritten to the level of the signal COL<C>, and if the output A0<C> is at the "H" level, the level of the output A0<C> is maintained. On the other hand, when the signal WARST becomes the "H" level, the level of the output A0<C> is reset to become the "L" level.

Hereinafter, the operation of the latch circuit 46B in the multi-write mode will be described.

FIG. 15 is a view showing the operation of the latch circuit 46B during the write operation in the multi-write mode of the semiconductor memory device according to the first embodiment.

As shown in FIG. 15, in the multi-write mode, the signal TMULTI_UWTC is at the "H" level before the time T2 in FIG. 11. In the initial state of the multi-write mode, the signal COL<C> is at the "L" level, and the output A0<C> is at the "L" level.

Thereafter, at the time T3 in FIG. 11, the column address is selected, and the signal COL<C> becomes the "H" level. At this time, since the signal TMULTI_UWTC at the "H" level and the output A0<C> at the "L" level are input to the NAND gate NA3, the output of the NAND gate NA3 becomes the "H" level. Accordingly, the output of the inverter IV9 becomes the "L" level, and the output of the NOR gate NO1 becomes the "L" level. Then, the "H" level is input to the inverter IV12 via the inverter IV10. When the signal BWENS based on the clock CLK becomes the "H" level, the inverter IV12 inverts an input signal and outputs the inverted input signal. Accordingly, the output of the inverter IV12 becomes the "L" level. Since the signal WARST is at the "L" level, the NOR gate NO2 rewrites the output A0<C> to the "H" level.

Subsequently, at the time T4 in FIG. 11, another column address is selected, and the signal COL<C> becomes the "L" level. At this time, since the signal TMULTI_UWTC at the "H" level and the output A0<C> at the "H" level are input to the NAND gate NA3, the output of the NAND gate NA3 becomes the "L" level. Accordingly, the output of the inverter IV9 becomes the "H" level, and the output of the NOR gate NO1 becomes the "L" level. Then, the "H" level is input to the inverter IV12 via the inverter IV10. When the signal BWENS based on the clock CLK becomes the "H" level, the inverter IV12 inverts an input signal and outputs the inverted input signal. Accordingly, the output of the inverter IV12 becomes the "L" level. Since the signal WARST is at the "L" level, the NOR gate NO2 maintains the output A0<C> at the "H" level.

That is, subsequently, until reset is performed (signal WARST becomes "H" level) or until the multi-write mode terminates (signal TMULTI_UWTC becomes "L" level) and is rewritten, the level of the output A0<C> is maintained at the "H" level. Thus, as described above, write pulses can be generated simultaneously for a plurality of columns.

Effects of First Embodiment

In the MRAM, the assertion and negation of the write pulse are set by negating the clock enable signal CKE, supplied to the CKE pin, twice, and writing is performed based on this write pulse. The CKE pin is shared by all columns. For this reason, when writing to all columns is performed sequentially, it is necessary to negate the clock enable signal CKE twice for one column (one write command), which takes a lot of time.

On the other hand, according to the first embodiment, the clock enable signal CKE is negated twice for a plurality of columns (a plurality of write commands), so that writing to a plurality of columns is performed simultaneously.

More specifically, writing is performed as follows. Firstly, the column C0 is selected by the first write command (output A0<C0> becomes "H" level). Then, the column C1 is selected by the second write command (output A0<C1> becomes "H" level). At this time, the latch circuit 46B in the pulse generation circuit 46 for the column C0 maintains the output A0<C0> at the "H" level. Thereafter, write pulses of the columns C0 and C1 are simultaneously generated by negating the clock enable signal CKE twice. As a result, writing of the columns C0 and C1 can be performed simultaneously, so that the writing time can be shortened.

In this example, the write operation in the test mode has been described, but the present invention is not limited thereto. This invention can also be applied to write operation in a user mode.

Second Embodiment

Hereinafter, a semiconductor memory device according to the second embodiment will be described with reference to FIGS. 16 and 17. In the second embodiment, points different from the first embodiment will be mainly described, and the same points are omitted.

Configuration Example of Second Embodiment

FIG. 16 is a block diagram showing the latch circuit 46B in the semiconductor memory device according to the second embodiment.

As shown in FIG. 16, the second embodiment is different from the first embodiment in that the signal WAYTE<C> is input to the latch circuit 46B.

More specifically, the signal WAYTE<C> from an AND gate AD2 is input to a NOR gate NO2 together with the output of an inverter IV12 and a signal WARST. The NOR gate NO2 provides the output A0<C>. The output A0<C> is fed back to a NAND gate NA3. Further, the output A0<C> is fed back to the NOR gate NO2 via an inverter IV13. The output of the inverter IV13 is input to the same terminal as the output of the inverter IV12.

Example of Write Operation in Second Embodiment

FIG. 17 is a view showing operation according to various signals of the latch circuit 46B in the semiconductor memory device according to the second embodiment.

As shown in FIG. 17, when the signal TMULTI_UWTC is at the "L" level, the latch circuit 46B is driven as a normal write mode. At this time, not only when the signal WARST becomes the "H" level, but also when the signal WATYE<C> becomes the "H" level, the level of the output A0<C> is reset to become the "L" level.

When the signal TMULTI_UWTC is at the "H" level, the latch circuit 46B is driven as a multi-write mode. At this time, similarly to the normal write mode, not only when the signal WARST becomes the "H" level, but also when the signal WATYE<C> becomes the "H" level, the level of the output A0<C> is reset to become the "L" level.

The signal WATYE<C> is a signal generated inside a memory 10 (pulse generation circuit 46) and is a signal that serves as a trigger for negation of a signal WRITE_PULSE<C>. That is, according to the second embodiment, the output A0<C> of the latch circuit 46B is reset at the same time that writing is terminated.

Effects of Second Embodiment

In the first embodiment, when the output A0<C> of the latch circuit 46B is maintained at the "H" level in the multi-write mode, unless the output is reset by the signal WARST or the mode is changed and rewritten by the signal TMULTI_UWTC, the output A0<C> cannot be reset to the "L" level. The signal WARST is a signal based on a write command, and the signal TMULTI_UWTC is a signal based on an MRW command. That is, the reset of the output A0<C> can be controlled only from outside.

On the other hand, according to the second embodiment, when the output A0<C> of the latch circuit 46B is maintained at the "H" level in the multi-write mode, the output A0<C> is reset to the "L" level also by the signal WAYTE<C>. The signal WATYE<C> is a signal generated inside the memory 10 (pulse generation circuit 46). Consequently, the reset of the output A0<C> can be controlled not only by an external signal but also by an internal signal.

Third Embodiment

Hereinafter, a semiconductor memory device according to the third embodiment will be described with reference to FIGS. 18 to 21. In the third embodiment, points different from the first embodiment will be mainly described, and the same points are omitted.

Configuration Example of Third Embodiment

FIG. 18 is a block diagram showing a memory cell array 11_0 and a read/write circuit 13_0 in the semiconductor memory device according to the third embodiment. Here is shown an example in which the memory cell array 11_0 includes columns C0 to C7.

As shown in FIG. 18, the third embodiment is different from the first embodiment in that the read/write circuit 13_0 includes a page buffer lock circuit 50.

In the write operation and the read operation, the page buffer lock circuit 50 locks access to page buffer circuits 43 (page buffer circuits 43 for columns C0 to C7) of the first to eighth read/write circuits 13_00 to 13_07. Consequently, in the write operation and the read operation, the page buffer lock circuit 50 does not update data of the page buffer circuits 43 for the columns C0 to C7. The page buffer lock circuit 50 is shared by the page buffer circuits 43 for the columns C0 to C7. The page buffer lock circuit 50 is applied when rewriting of the data of the page buffer circuit 43 is unnecessary, for example, in a test mode.

Hereinafter, the page buffer lock circuit 50 and the page buffer circuit 43 will be described in detail.

FIG. 19 is a block diagram showing the page buffer lock circuit 50 and the page buffer circuit 43 in the semiconductor memory device according to the third embodiment.

As shown in FIG. 19, the page buffer lock circuit 50 includes an inverter IV14 and AND gates AD3 and AD4.

A signal PB_LOCK is input to the inverter IV14. The signal PB_LOCK is a signal for controlling access to the page buffer circuit 43. The output of the inverter IV14 is input to the AND gate AD3. The output of the inverter IV14 and a signal BWENS2 are input to the AND gate AD3. The signal BWENS2 is a signal based on a write command. The output of the AND gate AD3 is input to the page buffer circuit 43 (AND gate AD5 of data transfer control circuit 60). Incidentally, the output of the AND gate AD3 is input to all the page buffer circuits 43 for the columns C0 to C7.

On the other hand, the output of the inverter IV14 is input to an AND gate AD4. The output of the inverter IV14 and a signal PRE_RSIOSTRBP are input to the AND gate AD4. The signal PRE_RSIOSTRBP is a signal based on a read command. The output of the AND gate AD4 becomes a signal RSIOSTRBP and is input to the page buffer circuit 43 (inverter IV15 of data transfer control circuit 60). The signal RSIOSTRBP is input to all the page buffer circuits 43 for the columns C0 to C7.

The page buffer circuit 43 includes the data transfer control circuit 60. The data transfer control circuit 60 includes the AND gate AD5, NAND gates NA4 and NA5, and the inverters IV15 to IV17.

The output of the AND gate AD3 of the page buffer lock circuit 50 and a signal COL<C> are input to the AND gate AD5. The output of the AND gate AD5 becomes a signal WSIOSTRBP<C>. The signal WSIOSTRBP<C> and a signal DM via the inverter IV16 are input to the NAND gate NA4. The output of the NAND gate NA4 and the signal RSIOSTRBP via the inverter IV15 are input to the NAND gate NA5. The output of the NAND gate NA5 becomes a signal PBCOL<C>. The signal PBCOL<C> becomes a signal PBCOLb<C> via the inverter IV17.

The signal PBCOL<C> is supplied to a control terminal of an NMOS transistor of a transfer gate TF3, and the signal PBCOLb<C> is supplied to a control terminal of a PMOS transistor of the transfer gate TF3.

Example of Write Operation in Third Embodiment

Figure 20:
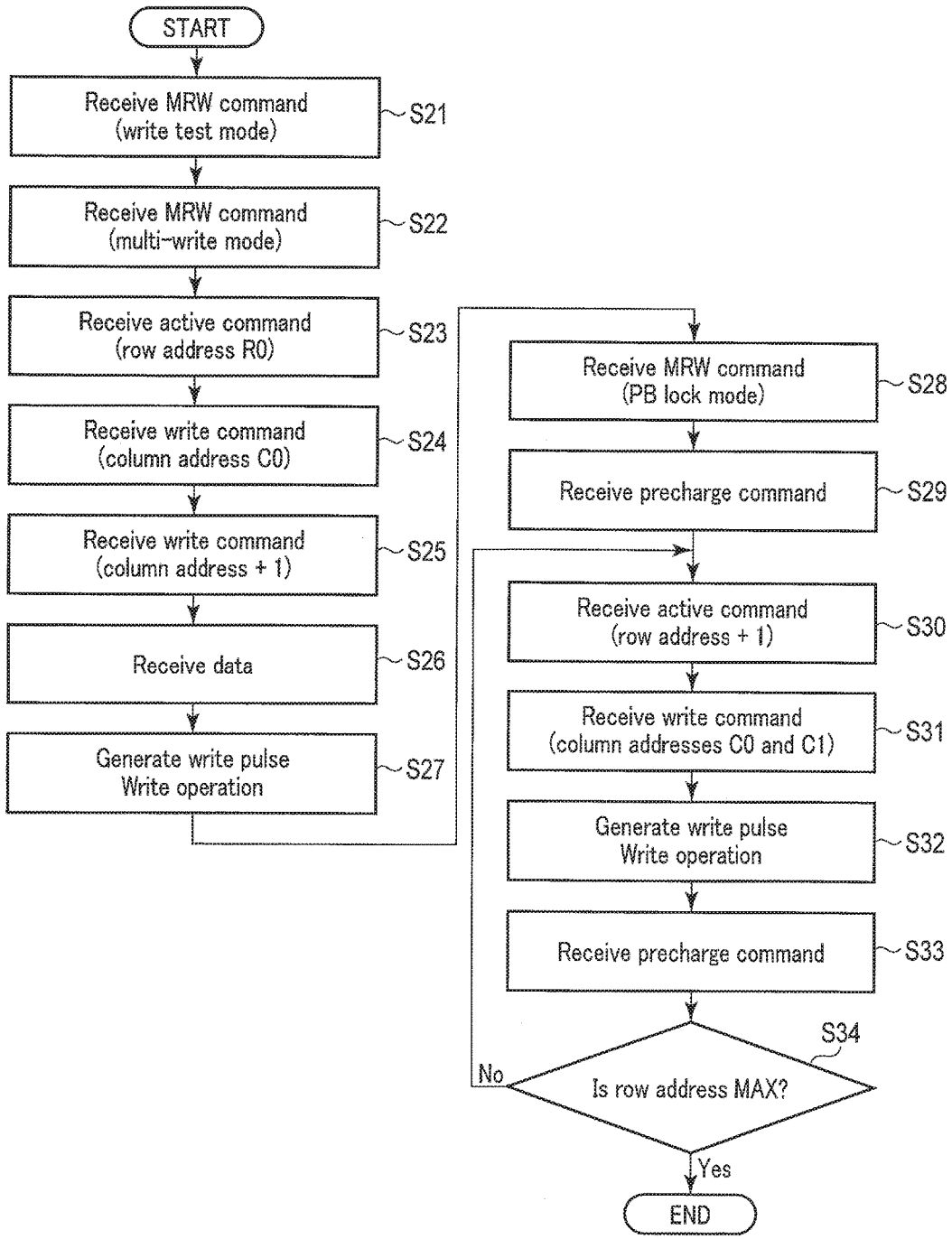
FIG. 20 is a flowchart of write operation of the semiconductor memory device according to the third embodiment.

FIG. 20 is a flowchart of write operation of the semiconductor memory device according to the third embodiment. Here, a test mode (write test mode) of the write operation will be described as an example.

As shown in FIG. 20, firstly in steps S21 to S27, operations similar to those of steps S11 to S17 of the first embodiment are performed. That is, the write operation is performed simultaneously on the columns C0 and C1.

Next, in step S28, a command/address circuit 16 receives an MRW command for a page buffer lock mode. Consequently, the page buffer lock circuit 50 sets the page buffer lock mode. The page buffer lock mode is a mode in which data of the page buffer circuit 43 is not updated when rewriting of the page buffer circuit 43 is unnecessary in the test mode or the like.

Then, in step S29, the command/address circuit 16 receives a precharge command. Consequently, the written columns C0 and C1 and row R0 are inactivated.

Then, in step S30, the command/address circuit 16 receives an active command. The active command includes a row address R. Here, the row (Row R1) next to the previously selected row R0 is selected. Consequently, the selected row R1 is activated.

Then, in step S31, the command/address circuit 16 receives the write command. The write command includes the column address C. In this case, the columns C0 and C1 previously written in the multi-write mode are fixed. Consequently, the columns C0 and C1 are activated as writing targets.

Then, in step S32, a pulse generation circuit 46 generates a write pulse. Here, the pulse generation circuit 46 of the first read/write circuit 13_00 coupled to the column C0 and the pulse generation circuit 46 of the second read/write circuit 13_01 coupled to the column C1 simultaneously generate write pulses. Consequently, the write operation is performed simultaneously on the columns C0 and C1.

At this time, the page buffer lock circuit 50 sets the page buffer lock mode. Consequently, new data from outside is not written into the page buffer circuit 43. That is, the page buffer circuit 43 maintains the same data as the write operation (the write operation in the columns C0 and C1 and the row R0) in step S27. Thus, in the write operation in the columns C0 and C1 and the row R1 in step S32, the same data as the columns C0 and C1 and the row R0 are written to a memory cell.

Then, in step S33, the command/address circuit 16 receives a precharge command. Consequently, the written columns C0 and C1 and row R1 are inactivated.

If the row address is not maximum (the last row address) (No in step S34), the operation in step S30 is performed. On the other hand, if the row address is maximum (Yes in step S34), the write operation ends.

Figure 21:
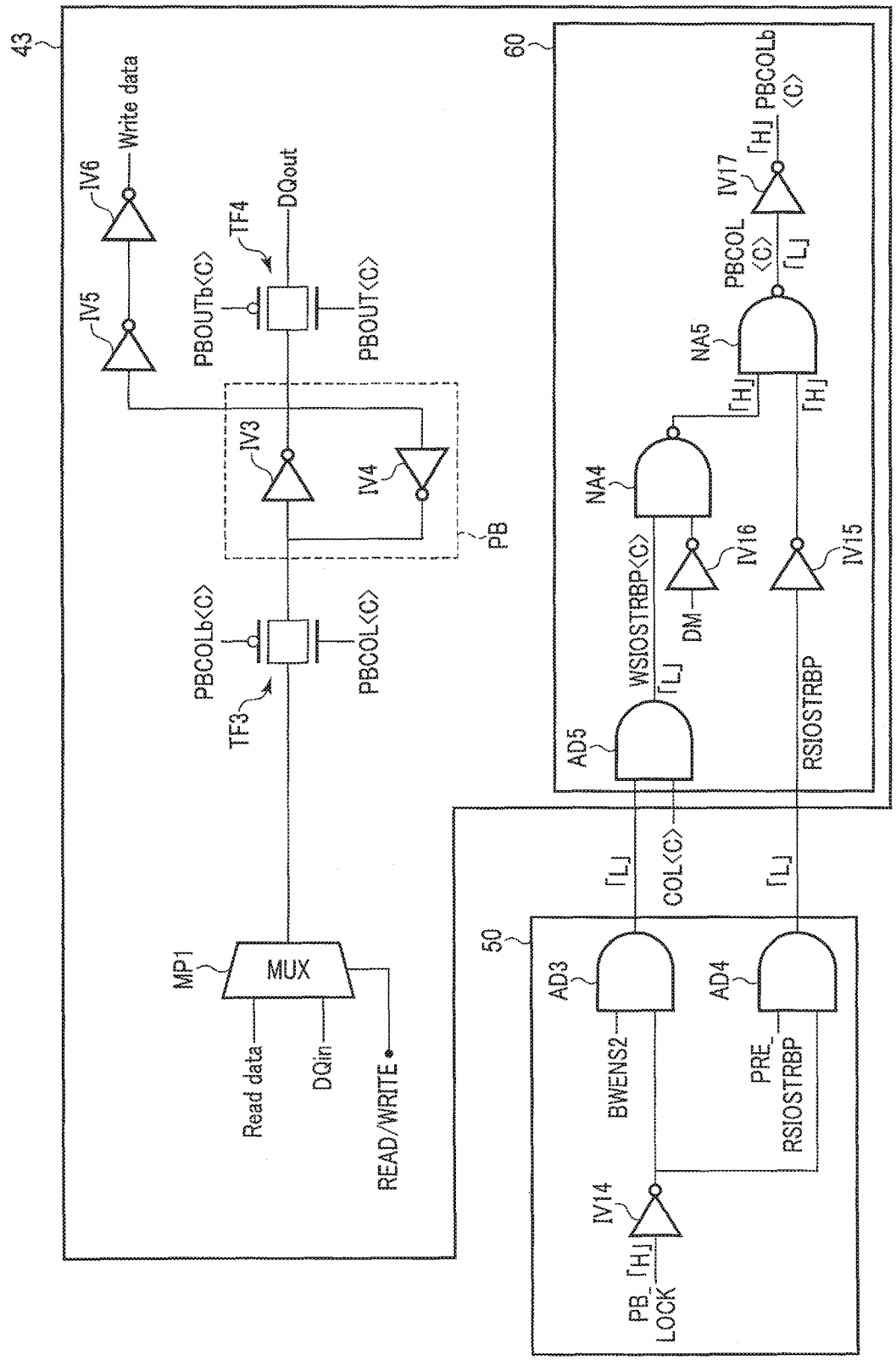
FIG. 21 is a view showing operation of the page buffer lock circuit in a page buffer lock mode of the semiconductor memory device according to the third embodiment.

FIG. 21 is a view showing operation of the page buffer lock circuit 50 in the page buffer lock mode of the semiconductor memory device according to the third embodiment.

As shown in FIG. 21, in the page buffer lock mode, the page buffer lock circuit 50 sets the signal PB_LOCK to the "H" level. Accordingly, the output of the inverter IV14 is the "L" level. The signal BWENS2 based on the write command becomes the "H" level during the write operation, and becomes the "L" level otherwise. However, since the output of the inverter IV14 is at the "L" level, the output of the AND gate AD3 becomes the "L" level irrespective of the signal BWENS2. Consequently, irrespective of the signal COL<C>, the AND gate AD5 outputs the signal WSIOSTRBP<C> at the "L" level. Since the signal WSIOSTRBP<C> is at the "L" level, the output of the NAND gate NA4 becomes the "H" level irrespective of the signal DM.

On the other hand, the signal PRE_RSIOSTRBP based on the read command becomes the "H" level during the read operation, and becomes the "L" level otherwise. However, since the output of the inverter IV14 is at the "L" level, the AND gate AD4 outputs the signal RSIOSTRBP at the "L"

level irrespective of the signal PRE_RSIOSTRBP. Consequently, the output of the inverter IV15 becomes the "H" level.

Since the output at the "H" level of the NAND gate NA4 and the output at the "H" level of the inverter IV15 are input to the NAND gate NA5, the NAND gate NA5 outputs the signal PBCOL<C> at the "L" level (signal PBCOLb<C> at "H" level).

The transfer gate TF3 is turned off by inputting the signal PBCOL<C> at the "L" level and the signal PBCOLb<C> at the "H" level. Accordingly, a signal Read Data (read data) and a signal DQin (write data) from a multiplexer MP1 are not written to a page buffer PB.

Effects of Third Embodiment

In the write test mode, writing is sequentially performed by fixing the column address and changing the row address. At this time, for example, the same data is written to all rows in the same column. Usually, in the write operation, the data of the page buffer circuit 43 of the selected column is rewritten each time the row is changed. Thus, in order to write the same data to all the rows in the same column, it is necessary to provide a set/reset circuit in the page buffer circuit 43. Then, regardless of data from the outside, data of the page buffer PB is set ("H" level) or reset ("L" level) and maintained. However, in this case, the set/reset circuit is required for all the page buffer circuits 43 for the columns C0 to C7, so that the circuit area increases.

On the other hand, in the third embodiment, the page buffer lock mode is set by the page buffer lock circuit 50. Consequently, in the write operation in the write test mode, the transfer gate TF3 can be turned off, and the data of the page buffer circuit 43 is not rewritten. Thus, the same data (data of the page buffer circuit 43 that is not updated) can be written to all the rows in the same column. That is, there is no need to provide a set/reset circuit, and the write operation in the write test mode can be performed while minimizing expansion of the circuit area.

Fourth Embodiment

Hereinafter, a semiconductor memory device according to the fourth embodiment will be described with reference to FIGS. 22 to 27. In the fourth embodiment, points different from the first embodiment will be mainly described, and the same points are omitted.

Configuration Example of Fourth Embodiment

FIG. 22 is a block diagram showing a memory cell array 11_0 and a read/write circuit 13_0 in the semiconductor memory device according to the fourth embodiment. Here, an example in which the memory cell array 11_0 includes the columns C0 to C7 is shown.

As shown in FIG. 22, the fourth embodiment is different from the first embodiment in that the read/write circuit 13_0 includes a multi-column decoding circuit 70.

In the write operation, the multi-column decoding circuit 70 selects and activates pulse generation circuits 46 (pulse generation circuits 46 for columns C0 to C7) of the first to eighth read/write circuits 13_00 to 13_07. At this time, the multi-column decoding circuit 70 decodes a column address to select one or a plurality of the pulse generation circuits 46 among the pulse generation circuits 46 for the columns C0 to C7. The selected one or a plurality of pulse generation circuits 46 simultaneously generate write pulses.

The multi-column decoding circuit 70 will be described in detail below.

Figure 23:
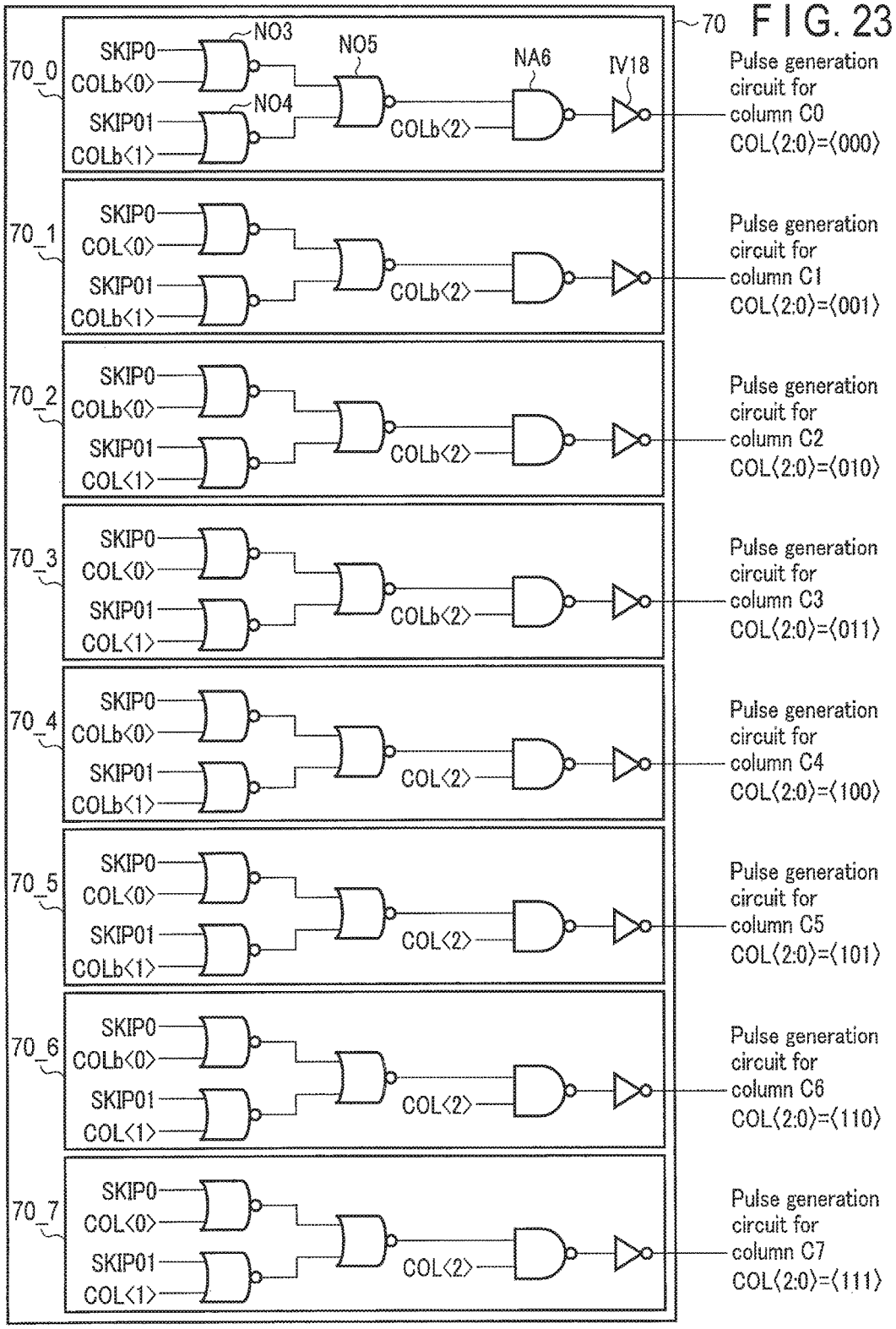
FIG. 23 is a circuit diagram showing a multi-column decoding circuit in the semiconductor memory device according to the fourth embodiment.

FIG. 23 is a circuit diagram showing the multi-column decoding circuit 70 in the semiconductor memory device according to the fourth embodiment. Here is shown an example in which the pulse generation circuits 46 for the columns C0 to C7 are indicated by a 3-bit column address signal COL<2:0> (upper bit COL<2>, middle bit COL<1>, lower bit COL<0>). The column address signals COL<2:0> of the columns C0 to C7 are represented by <000>, <001>, <010>, <011>, <100>, <101>, <110> and <111>, respectively. "0" indicates the "L" level, and "1" indicates the "H" level.

As shown in FIG. 23, the multi-column decoding circuit 70 includes first to eighth column decoding circuits 70_0 to 70_7.

The first column decoding circuit 70_0 includes NOR gates NO3 to NO5, a NAND gate NA6, and an inverter IV18.

A signal SKIP0 and a signal COLb<0> are input to the NOR gate NO3. The output of the NOR gate NO3 is input to the NOR gate NO5. A signal SKIP01 and a signal COLb<1> are input to the NOR gate NO4. The output of the NOR gate NO4 is input to the NOR gate NO5. The output of the NOR gate NO3 and the output of the NOR gate NO4 are input to the NOR gate NO5. The output of the NOR gate NO5 is input to the NAND gate NA6. The output of the NAND gate NA6 is input to the inverter IV18. The output of the inverter IV18 (output of first column decoding circuit 70_0) is input to the pulse generation circuit 46 for the column C0.

Similarly to the first column decoding circuit 70_0, the second to eighth column decoding circuits 70_1 to 70_7 each include the NOR gates NO3 to NO5, the NAND gate NA6, and the inverter IV18. However, in the second to eighth column decoding circuits 70_1 to 70_7, column address signals input to the NOR gates NO3 to NO5, the NAND gate NA6, and the inverter IV18 are different.

In the second column decoding circuit 70_1, the signal COL<0> is input to the NOR gate NO3, the signal COLb<1> is input to the NOR gate NO4, and a signal COLb<2> is input to the NOR gate NO5. The output of the second column decoding circuit 70_1 is input to the pulse generation circuit 46 for the column C1.

In the third column decoding circuit 70_2, the signal COLb<0> is input to the NOR gate NO3, a signal COL<1> is input to the NOR gate NO4, and the signal COLb<2> is input to the NOR gate NO5. The output of the third column decoding circuit 70_2 is input to the pulse generation circuit 46 for the column C2.

In the fourth column decoding circuit 70_3, the signal COL<0> is input to the NOR gate NO3, the signal COL<1> is input to the NOR gate NO4, and the signal COLb<2> is input to the NOR gate NO5. The output of the fourth column decoding circuit 70_3 is input to the pulse generation circuit 46 for the column C3.

In the fifth column decoding circuit 70_4, the signal COLb<0> is input to the NOR gate NO3, the signal COLb<1> is input to the NOR gate NO4, and the signal COL<2> is input to the NOR gate NO5. The output of the fifth column decoding circuit 70_4 is input to the pulse generation circuit 46 for the column C4.

In the sixth column decoding circuit 70_5, the signal COL<0> is input to the NOR gate NO3, the signal COLb<1> is input to the NOR gate NO4, and the signal COL<2> is input to the NOR gate NO5. The output of the sixth column decoding circuit 70_5 is input to the pulse generation circuit 46 for the column C5.

In the seventh column decoding circuit 70_6, the signal COLb<0> is input to the NOR gate NO3, the signal COL<1> is input to the NOR gate NO4, and the signal COL<2> is input to the NOR gate NO5. The output of the seventh column decoding circuit 70_6 is input to the pulse generation circuit 46 for the column C6.

In the eighth column decoding circuit 70_7, the signal COL<0> is input to the NOR gate NO3, the signal COL<1> is input to the NOR gate NO4, and the signal COL<2> is input to the NOR gate NO5. The output of the eighth column decoding circuit 70_7 is input to the pulse generation circuit 46 for the column C7.

Example of Write Operation in Fourth Embodiment

Figure 25:
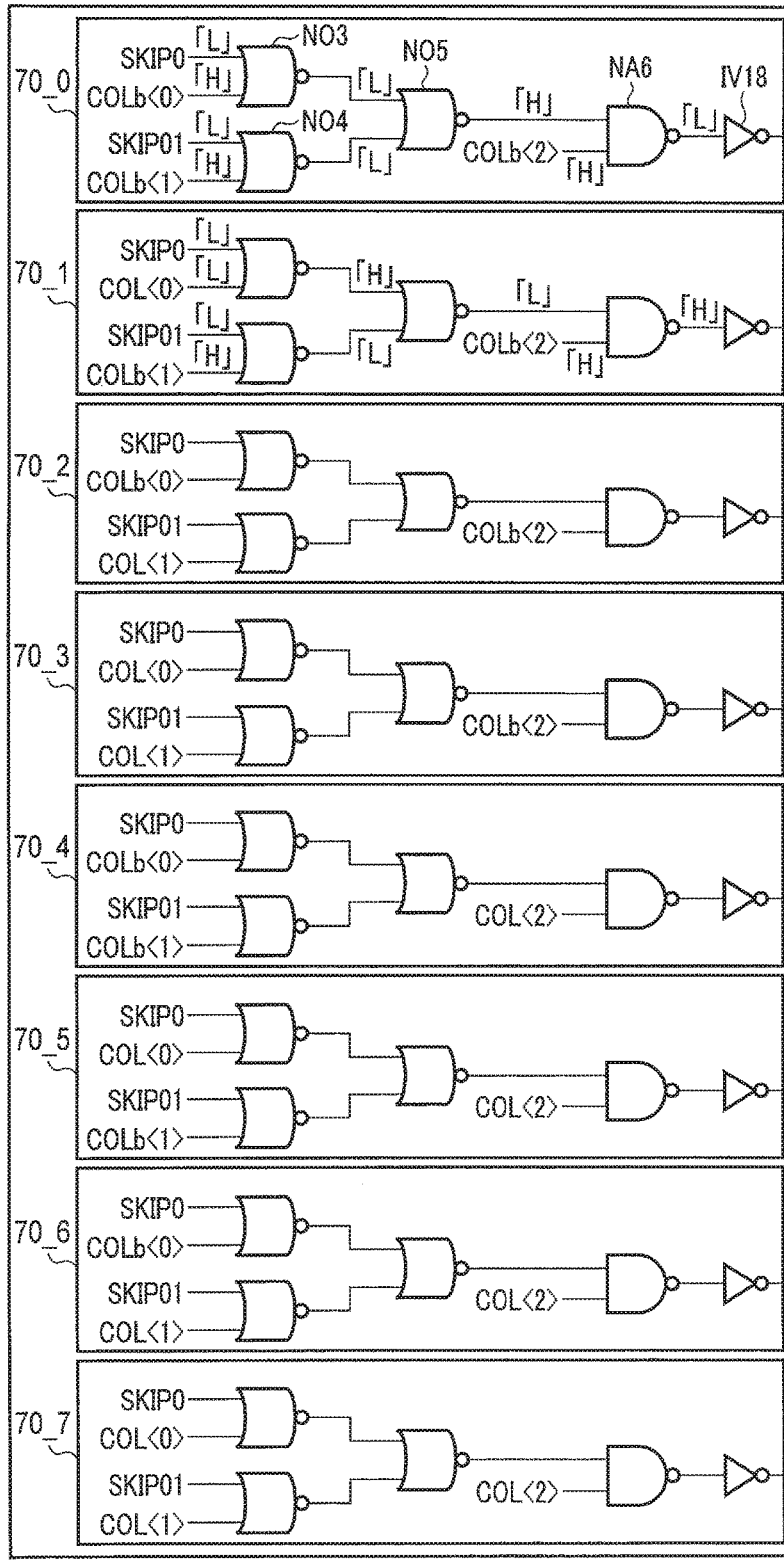
FIG. 25 is a view showing operation of the multi-column decoding circuit at the time of decoding in the semiconductor memory device according to the fourth embodiment.
Figure 27:
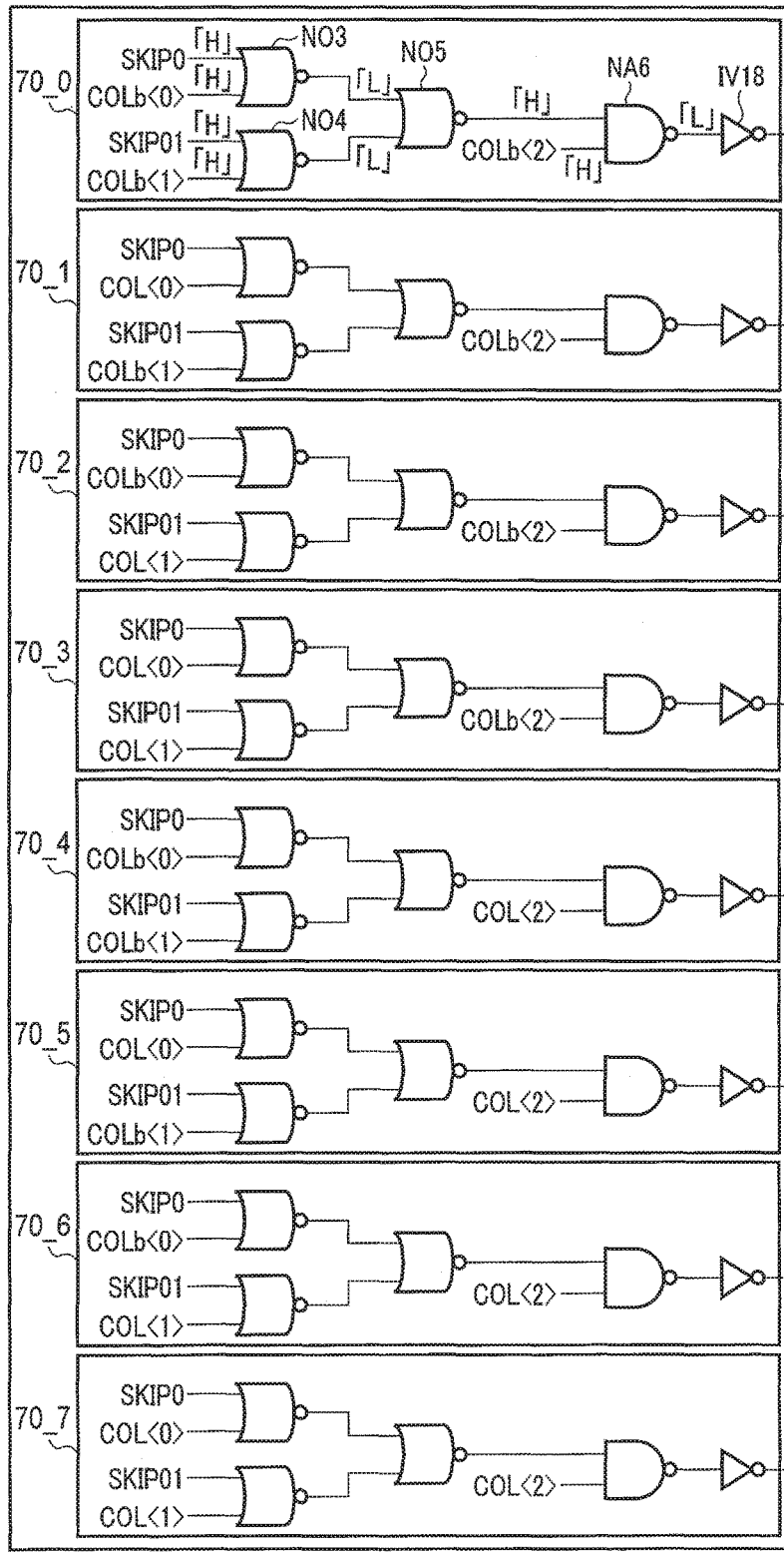
FIG. 27 is a view showing the operation of the multi-column decoding circuit at the time of decoding in the semiconductor memory device according to the fourth embodiment.

FIG. 24 is a view showing operation according to various signals of the multi-column decoding circuit 70 in the semiconductor memory device according to the fourth embodiment. FIGS. 25 to 27 are views showing the operation of the multi-column decoding circuit 70 at the time of decoding in the semiconductor memory device according to the fourth embodiment.

In the present example, the multi-column decoding circuit 70 decodes a 3-bit column address while controlling the signals SKIP01 and SKIP0, whereby one, two, or four of the pulse generation circuits 46 are selected among the pulse generation circuits 46 for the columns C0 to C7.

Firstly, as shown in FIG. 24, the case where the signal SKIP01 is at the "L" level and the signal SKIP0 is at the "L" level will be described. In this case, one of the pulse generation circuits 46 is selected by each 3-bit column address signal.

For example, as shown in FIG. 25, the case where the column address signal COL<2:0> is <000> (COL<2>="L", COL<1>="L", COL<0>="L") will be described as an example.

At this time, in the first column decoding circuit 70_0, the signal SKIP0 at the "L" level and the signal COLb<0> at the "H" level are input to the NOR gate NO3. Consequently, the output of the NOR gate NO3 becomes the "L" level. On the other hand, the signal SKIP01 at the "L" level and the signal COLb<1> at the "H" level are input to the NOR gate NO4. Consequently, the output of the NOR gate NO4 becomes the "L" level. Since the output at the "L" level of the NOR gate NO3 and the output at the "L" level of the NOR gate NO4 are input to the NOR gate NO5, the output of the NOR gate NO5 becomes the "H" level. Since the output at the "H" level of the NOR gate NO5 and the signal COLb<2> at the "H" level are input to the NAND gate NA6, the output of the NAND gate NA6 becomes the "L" level. Then, the output of the inverter IV18 becomes the "H" level. Accordingly, the output at the "H" level is input to the pulse generation circuit 46 for the column C0, and the pulse generation circuit 46 for the column C0 is activated.

On the other hand, in the second column decoding circuit 70_1, the signal SKIP0 at the "L" level and the signal COL<0> at the "L" level are input to the NOR gate NO3. Consequently, the output of the NOR gate NO3 becomes the "H" level. On the other hand, the signal SKIP01 at the "L" level and the signal COLb<1> at the "H" level are input to the NOR gate NO4. Consequently, the output of the NOR gate NO4 becomes the "L" level. Since the output at the "H" level of the NOR gate NO3 and the output at the "L" level of the NOR gate NO4 are input to the NOR gate NO5, the output of the NOR gate NO5 becomes the "L" level. Since the output at the "L" level of the NOR gate NO5 and the signal COLb<2> at the "H" level are input to the NAND gate NA6, the output of the NAND gate NA6 becomes the "H" level. Then, the output of the inverter IV18 becomes the "L" level. Accordingly, the output at the "L" level is input to the pulse generation circuit 46 for the column C1, and the pulse generation circuit 46 for the column C1 is activated.

The third to eighth column decoding circuits 70_2 to 70_7 output the "L" level, similarly to the second column decoding circuit 70_1. Consequently, the pulse generation circuits 46 for the columns C2 to C7 are inactivated.

Accordingly, as shown in FIG. 24, when the signal SKIP01 is at the "L" level, the signal SKIP0 is at the "L" level, and the column address signal COL<2:0> is <000>, the pulse generation circuit 46 for the column C0 is activated.

Similarly, when the column address signal COL<2:0> is <001>, the pulse generation circuit 46 for the column C1 is activated. When the column address signal COL<2:0> is <010>, the pulse generation circuit 46 for the column C2 is activated. When the column address signal COL<2:0> is <011>, the pulse generation circuit 46 for the column C3 is activated. When the column address signal COL<2:0> is <100>, the pulse generation circuit 46 for the column C4 is activated. When the column address signal COL<2:0> is <101>, the pulse generation circuit 46 for the column C5 is activated. When the column address signal COL<2:0> is <110>, the pulse generation circuit 46 for the column C6 is activated. When the column address signal COL<2:0> is <111>, the pulse generation circuit 46 for the column C7 is activated.

As described above, when the signal SKIP01 is at the "L" level and the signal SKIP0 is at the "L" level, one of the pulse generation circuits 46 is selected by each 3-bit column address signal.

Next, as shown in FIG. 24, the case where the signal SKIP01 is at the "L" level and the signal SKIP0 is at the "H" level will be described. In this case, two of the pulse generation circuits 46 are selected by each 3-bit column address signal.

For example, as shown in FIG. 26, the case where the column address signal COL<2:0> is <000> will be described as an example.

At this time, in the first column decoding circuit 70_0, the signal SKIP0 at the "H" level and the signal COLb<0> at the "H" level are input to the NOR gate NO3.

Consequently, the output of the NOR gate NO3 becomes the "L" level. That is, since the signal SKIP0 at the "H" level is input, the output of the NOR gate NO3 becomes the "L" level irrespective of the signal COLb<0> (lower bit COL<0>). Consequently, similarly to FIG. 25, the first column decoding circuit 70_0 outputs the "H" level. Accordingly, the pulse generation circuit 46 for the column C0 is activated.

As described above, when the signal SKIP0 is at the "H" level, the final output is the same irrespective of the lower bit COL<0>. On the other hand, when the upper bit COL<2> or the middle bit COL<1> is different, the final output is different.

The column address of the column C1 is different from the column C0 only in the lower bit COL<0>. Thus, the second column decoding circuit 70_1 outputs the "H" level, similarly to the first column decoding circuit 70_0. Accordingly, the pulse generation circuit 46 for the column C1 is activated.

On the other hand, the column addresses of the columns C2 to C7 are different from the column C0 in the upper bit COL<2> or the middle bit COL<1>. Thus, the third to eighth column decoding circuits 70_2 to 70_7 output the "L" level unlike the first column decoding circuit 70_0. Accordingly, the pulse generation circuits 46 for the columns C2 to C7 are inactivated.

Similarly, when the column address signal COL<2:0> is <001>, the pulse generation circuits 46 for the columns C0 and C1 are activated. When the column address signals COL<2:0> are <010> and <011>, the pulse generation circuits 46 for the columns C2 and C3 are activated. When the column address signals COL<2:0> are <100> and <101>, the pulse generation circuits 46 for the columns C4 and C5 are activated. When the column address signals COL<2:0> are <110> and <111>, the pulse generation circuits 46 for the columns C6 and C7 are activated.

As described above, when the signal SKIP01 is at the "L" level and the signal SKIP0 is at the "H" level, two of the pulse generation circuits 46 are selected by each 3-bit column address signal.

Next, as shown in FIG. 24, the case where the signal SKIP01 is at the "H" level and the signal SKIP0 is at the "H" level will be described. In this case, four of the pulse generation circuits 46 are selected by each 3-bit column address signal.

For example, as shown in FIG. 27, the case where the column address signal COL<2:0> is <000> will be described as an example.

At this time, in the first column decoding circuit 70_0, the signal SKIP0 at the "H" level and the signal COLb<0> at the "H" level are input to the NOR gate NO3. Consequently, the output of the NOR gate NO3 becomes the "L" level. That is, since the signal SKIP0 at the "H" level is input, the output of the NOR gate NO3 becomes the "L" level irrespective of the signal COLb<0> (lower bit COL<0>). The signal SKIP01 at the "H" level and the signal COLb<1> at the "H" level are input to the NOR gate NO4. That is, since the signal SKIP01 at the "H" level is input, the output of the NOR gate NO4 becomes the "L" level irrespective of the signal COLb<1> (middle bit COL<1>). Consequently, similarly to FIG. 25, the first column decoding circuit 70_0 outputs the "H" level. Accordingly, the pulse generation circuit 46 for the column C0 is activated.

As described above, when the signals SKIP0 and SKIP01 are at the "H" level, the final output is the same irrespective of the lower bit COL<0> and the middle bit COL<1>. On the other hand, when the upper bit COL<2> is different, the final output is different.

The column addresses of the columns C1 to C3 are different from the column C0 in the lower bit COL<0> or the upper bit COL<0>. Thus, the second to fourth column decoding circuits 70_1 to 70_3 output the "H" level, similarly to the first column decoding circuit 70_0. Accordingly, the pulse generation circuits 46 for the columns C1 to C3 are activated.

On the other hand, the column addresses of the columns C4 to C7 are different from the column C0 in the upper bit COL<2>. Thus, the fifth to eighth column decoding circuits 70_4 to 70_7 output the "L" level unlike the first column decoding circuit 70_0. Accordingly, the pulse generation circuits 46 for the columns C4 to C7 are inactivated.

Similarly, when the column address signals COL<2:0> are <001>, <010>, and <011>, the pulse generation circuits 46 for the columns C0 to C3 are activated. When the column address signals COL<2:0> are <100>, <101>, <110> and <111>, the pulse generation circuits 46 for the columns C4 to C7 are activated.

As described above, when the signal SKIP01 is at the "H" level and the signal SKIP0 is at the "H" level, four of the pulse generation circuits 46 are selected by each 3-bit column address signal.

Effects of Fourth Embodiment

According to the fourth embodiment, the read/write circuit 13_0 includes the multi-column decoding circuit 70. In the write operation, the multi-column decoding circuit 70 selects and activates the pulse generation circuits 46 for the columns C0 to C7. At this time, the multi-column decoding circuit 70 decodes the column address, and thereby can select one or a plurality of the pulse generation circuits 46 among the pulse generation circuits 46 for the columns C0 to C7. This makes it possible to realize the operation as shown in each of the above embodiments, that is, the operation in which the selected one or a plurality of pulse generation circuits 46 simultaneously generate write pulses.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first memory cell having a first variable resistance element;
   a second memory cell having a second variable resistance element; and
   a first circuit which controls writing to the first memory cell and the second memory cell,
   wherein the first circuit:
      receives a first command instructing writing to the first memory cell,
      after receiving the first command, receives a second command instructing writing to the second memory cell, and
      after receiving the second command, simultaneously generates a first signal for performing writing to the first memory cell and a second signal for performing writing to the second memory cell.

2. The device of claim 1, wherein:
   when the first signal is in an asserted state, writing to the first memory cell is performed, and when the second signal is in the asserted state, writing to the second memory cell is performed,
   the first signal and the second signal are asserted based on first negation of a third signal, and the first signal and the second signal are negated based on second negation of the third signal.

3. The device of claim 2, wherein:
   a fourth signal is asserted based on the first command, and a fifth signal is asserted based on the second command,
   when the fourth signal is in the asserted state, the first signal is asserted, and when the fifth signal is in the asserted state, the second signal is asserted.

4. The device of claim 3, wherein the asserted state of the fourth signal is maintained when the second command is received.

5. The device of claim 4, wherein before receiving the first command, the first circuit receives a third command instructing switching of modes.

6. The device of claim 5, wherein
a sixth signal is asserted based on the third command, and the asserted state of the fourth signal is maintained when the sixth signal is in the asserted state.

7. The device of claim 1, wherein:
after writing to the second memory cell is performed when writing to the first memory cell is performed, the first circuit receives a fourth command configured to switch a mode,
after the fourth command is received, the first circuit receives a fifth command instructing writing to the first memory cell and the second memory cell, and
data in the first circuit is not updated after the fifth command is received.

8. The device of claim 1, wherein the first circuit includes:
a second circuit which outputs a fifth signal based on a third signal and a fourth signal,
a third circuit which outputs a seventh signal based on the fifth signal and a sixth signal,
a fourth circuit which outputs a ninth signal based on the fifth signal and an eighth signal,
a fifth circuit which outputs the first signal based on the seventh signal and the ninth signal, and
the second circuit maintains an asserted state of the fifth signal when the third signal is in the asserted state.

9. The device of claim 8, wherein:
writing to the first memory cell is performed when the first signal is in the asserted state,
the first signal is asserted based on first negation of a tenth signal, and the first signal is negated based on second negation of the fifth signal.

10. The device of claim 8, wherein:
the fifth signal is asserted based on the first command, and
the first signal is asserted when the fifth signal is in the asserted state.

11. The device of claim 10, wherein the asserted state of the fifth signal is maintained when the second command is received.

12. The device of claim 11, wherein the first signal is asserted based on a third command instructing switching of modes.

* * * * *